United States Patent
Kondo

(10) Patent No.: US 7,180,924 B2
(45) Date of Patent: Feb. 20, 2007

(54) SEMICONDUCTOR APPARATUS AND A SEMICONDUCTOR UNIT, THE SEMICONDUCTOR UNIT INCLUDING A FUNCTIONAL LAYER INCLUDING A SEMICONDUCTOR ELEMENT, AND A HIGHLY CONDUCTIVE LAYER

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/442,096

(22) Filed: May 21, 2003

(65) Prior Publication Data

US 2004/0016932 A1    Jan. 29, 2004

(30) Foreign Application Priority Data

May 30, 2002  (JP)  ............... 2002-157241

(51) Int. Cl.
  *H01S 5/00*  (2006.01)
(52) U.S. Cl. .............. 372/45.01; 257/85; 257/94; 372/45.012
(58) Field of Classification Search .......... 257/85, 257/94; 372/44, 45, 44.01, 45.01, 45.012
  See application file for complete search history.

(56) References Cited

U.S. PATENT DOCUMENTS

| | | |
|---|---|---|
| 5,073,230 A | 12/1991 | Maracas et al. |
| 5,244,818 A | 9/1993 | Jokerst et al. |
| 5,280,184 A | 1/1994 | Jokerst et al. |
| 5,286,335 A | 2/1994 | Drabik et al. |
| 5,391,257 A | 2/1995 | Sullivan et al. |
| 5,401,983 A | 3/1995 | Jokerst et al. |
| 5,465,009 A | 11/1995 | Drabik et al. |
| 5,633,886 A | 5/1997 | Ramdani et al. |
| 5,656,548 A | 8/1997 | Zavracky et al. |
| 5,827,751 A | 10/1998 | Nuyen |
| 6,033,995 A | 3/2000 | Muller |
| 6,214,733 B1 | 4/2001 | Sickmiller |
| 6,320,206 B1 * | 11/2001 | Coman et al. ............... 257/94 |
| 6,343,171 B1 | 1/2002 | Yoshimura et al. |
| 6,720,585 B1 * | 4/2004 | Wasserbauer et al. ........ 257/98 |
| 6,775,310 B2 * | 8/2004 | Sai et al. ..................... 372/45 |

FOREIGN PATENT DOCUMENTS

JP    A 57-51781    3/1982

(Continued)

OTHER PUBLICATIONS

Magazine Article, "Erekutoronikusu" (electronics), Oct. 2000, pp. 37-40 (Partial translation pp. 38-40).

(Continued)

*Primary Examiner*—Gene M. Munson
(74) *Attorney, Agent, or Firm*—Oliff & Berridge, PLC

(57) ABSTRACT

The invention provides a semiconductor unit and a semiconductor apparatus having a low electric resistance as a whole, even when the electric resistance of a functional layer or a semiconductor substrate is high. A method of making the semiconductor unit and apparatus is also provided. An electrooptic apparatus and an electronic apparatus are also provided. A semiconductor apparatus includes a predetermined substrate and a semiconductor unit bonded to the substrate. The semiconductor unit includes a highly conductive layer and a functional layer including a semiconductor element.

13 Claims, 20 Drawing Sheets

FOREIGN PATENT DOCUMENTS

| | | |
|---|---|---|
| JP | A 59-194393 | 11/1984 |
| JP | A 63-70257 | 3/1988 |
| JP | A 63-175860 | 7/1988 |
| JP | A 2-135359 | 5/1990 |
| JP | A 2-135361 | 5/1990 |
| JP | A 2-209988 | 8/1990 |
| JP | A 3-37992 | 2/1991 |
| JP | 03-142974 | 6/1991 |
| JP | A 3-152184 | 6/1991 |
| JP | A 6-151720 | 5/1994 |
| JP | A 6-151946 | 5/1994 |
| JP | A 7-30209 | 1/1995 |
| JP | 07-193275 | 7/1995 |
| JP | 07-202265 | 8/1995 |
| JP | 08-090832 | 4/1996 |
| JP | 08-125225 | 5/1996 |
| JP | A 9-503622 | 4/1997 |
| JP | 09-153644 | 6/1997 |
| JP | A 9-186240 | 7/1997 |
| JP | 11-243257 | 9/1999 |
| JP | A 2000-114581 | 4/2000 |
| JP | 2000-332354 | 11/2000 |
| JP | 2001-135890 | 5/2001 |

OTHER PUBLICATIONS

Magazine Article, "Denshi joho tushin gakkai ronbunshi" (compilation of papers from the institute of electronics, information, and communication engineers), Sep. 2001, vol. J84-C. No. 9 (Partial translation pp. 788).

* cited by examiner

ELECTRON SUPPLY LAYER  ACTIVE LAYER  ELECTRON SUPPLY LAYER
HETERO GAP LAYER  HETERO GAP LAYER

SEMICONDUCTOR APPARATUS AND A SEMICONDUCTOR UNIT, THE SEMICONDUCTOR UNIT INCLUDING A FUNCTIONAL LAYER INCLUDING A SEMICONDUCTOR ELEMENT, AND A HIGHLY CONDUCTIVE LAYER

BACKGROUND OF THE INVENTION

1. Field of the Invention

The present invention relates to semiconductor units, semiconductor apparatuses, methods of making the same, electrooptic apparatuses and electronic apparatuses. In particular, the invention relates to a semiconductor unit and a semiconductor apparatus prepared by transferring a semiconductor element on a work piece (e.g., substrate) composed of a material different from that of the semiconductor element, and to a method of making the semiconductor unit and the semiconductor apparatus.

2. Description of Related Art

The related art includes a technology of forming a semiconductor element on a substrate composed of a material different from that of the semiconductor element. Examples thereof include a technology of forming a GaAs surface emitting laser (vertical cavity surface emitting laser (VCSEL)), a photodetector (PD) such as a photodiode, or a high electron mobility transistor (HEMT) on a silicon semiconductor substrate, and a technology of affixing micro silicon transistors, instead of thin film transistors (TFTs) for pixels of liquid crystal display (LCD), on a glass substrate.

One example of an integrated circuit constituted from semiconductors of different materials is an opto-electronic integrated circuit (OEIC). An opto-electronic integrated circuit is an integrated circuit with an optical input/output device. Signal processing inside the integrated circuit is performed by electrical signals but input/output operation between the integrated circuit and an external component is performed by optical signals.

As the inner structures of the integrated circuit are miniaturized, the operating speed of the central processing unit (CPU) of a computer, i.e., the operating clock, is also increased. However, the signal transfer rate at the bus has almost reached its limit, and this has become the bottleneck of increasing the processing rate of computers. If signal processing can be done through optical signals at the bus, it becomes possible to significantly increase the processing rate of computers beyond this limit. In order to do so, micro light-emitting and photo-detecting elements must be mounted to the silicon integrated circuit.

Silicon, which is an indirect semiconductor, cannot emit light. Silicon must be combined with other semiconductor light-emitting elements to form an integrated circuit.

In the related art, a prospective candidate for semiconductor light-emitting elements is a surface emitting laser (VCSEL) composed of a compound semiconductor such as gallium arsenide (GaAs). However, the lattice mismatch between silicon and the surface emitting laser has prevented direct formation of the surface emitting laser on the silicon integrated circuit through a semiconductor process such as an epitaxial process.

Generally, the surface emitting laser is formed on a gallium arsenide substrate. One prospective related art method is to form surface emitting laser chips from the surface emitting lasers disposed on the GaAs substrate and mechanically mounting these chips on silicon integrated circuit substrates to integrate electrical signal transfer circuits and optical signal transfer circuits.

On the other hand, in order to enhance the areal efficiency of the semiconductor substrate on which integrated circuits are formed and in order to simplify handling after integration, the size of the surface emitting laser chip on the integrated circuit is preferably as small as possible. Ideally, the chip is of approximately the same size as when an integrated circuit is monolithically fabricated, i.e., several micrometers in thickness and several ten square micrometers in area.

SUMMARY OF THE INVENTION

However, when the chip size is reduced to a thickness of several micrometers, the electric resistance of the chip itself increases, resulting in problems, such as an increase in driving voltage and an increase in calorific value of the element. These problems also occur when a semi-insulating GaAs substrate is used in a surface emitting laser array to prevent cross-talk, other than when the element is formed into a chip. In the surface emitting laser array, because the conductivity of the substrate is low, the electric resistance is large even when the substrate is thick.

The following two articles (magazine, "Erekutoronikusu" (electronics), October 2000, pp. 37 to 40) and (magazine, "Denshi joho tushin gakkai ronbunshi" (compilation of papers from the institute of electronics, information, and communication engineers), September 2001, Vol. J84-C. No. 9) disclose methods and technology of reducing the chip size to several micrometers in thickness. The technology disclosed in these documents removes the substrate by polishing, and only a functional layer (several micrometers) at the surface that functions as a semiconductor element is transferred to another supporting substrate, is shaped into a desired size by handling and photolithography, and is bonded onto a final substrate. In this manner, a semiconductor layer (functional layer) several micrometers in thickness functioning as a desired semiconductor element can be formed at a desired position of the final substrate. The semiconductor layer is worked through a common semiconductor process into a product with electrodes and the like.

One drawback of the technology disclosed in the above two articles is that a rigid supporting substrate is required since the semiconductor substrate is removed by polishing. As a result, bonding of the functional layer on the final substrate must be performed in full scale. In other words, portions of the semiconductor film other than required portions must be removed prior to the bonding, which is particularly wasteful. Moreover, since the bonded portion is a mere functional layer, a semiconductor process must be performed after the bonding. Thus, the inefficiency of processing the element with final substrate is acute when the alignment density of the desired semiconductor elements is small.

The present invention addresses or overcomes the above and/or other problems, and provides a semiconductor unit and a semiconductor apparatus having low electric resistance as a whole, even when the electric resistance of the functional layer and the semiconductor substrate is high. Moreover, the efficiency of using a semiconductor substrate, on which semiconductor elements are formed, can be increased and the manufacturing process can be streamlined when forming semiconductor elements on substrates composed of a material different from that of the semiconductor elements. The present invention also relates to a method of making the semiconductor unit and the semiconductor apparatus, to an electrooptic apparatus, and to an electronic apparatus.

To address or achieve the above, the present invention provides a semiconductor unit including a functional layer including a semiconductor element; and a highly conductive layer.

With this structure, even when the resistance of the functional layer is high, the combined resistance of the highly conductive layer and the functional layer can be reduced because the resistance of the highly conductive layer is low. Thus, the electric resistance of the semiconductor unit as a whole can be decreased. The present invention is particularly effective when the thickness of the functional layer is small and the resistance thereof is high. The semiconductor element may be a compound semiconductor or a silicon semiconductor.

A semiconductor apparatus is characterized by including a semiconductor substrate; a functional layer including a semiconductor element, the functional layer being formed on a surface of the semiconductor substrate; and a highly conductive layer.

With this structure, even when the resistance of the functional layer or the semiconductor substrate is high, the combined resistance can be reduced because the resistance of the highly conductive layer is low. Thus, the electric resistance of the semiconductor unit as a whole can be decreased. The present invention is particularly effective when the thickness of the functional layer is small and the resistance thereof is high. The semiconductor element may be a compound semiconductor or a silicon semiconductor.

The present invention also provides a semiconductor apparatus including the above-described semiconductor unit bonded on a predetermined substrate.

With this structure, the electric resistance of the semiconductor unit can be reduced due to the highly conductive layer, and the semiconductor element can be bonded to any workpiece, e.g., a silicon compound substrate or a compound conductor substrate. According to the present invention, a semiconductor element, such as a GaAs surface emitting laser or a photodiode, composed of a material different from that of the semiconductor substrate can be formed on the substrate.

The semiconductor substrate of the semiconductor apparatus of the present invention may exhibit a semi-insulating property or may include an insulating layer.

With this structure, the electric resistance of the semiconductor substrate is increased, and the effect of reducing the electric resistance of the semiconductor apparatus due to the highly conductive layer becomes more acute.

In the semiconductor apparatus of the present invention, electrodes to drive the semiconductor element may be formed at an upper face of the functional layer.

With this structure, even when the resistance of the functional layer or the semiconductor substrate is high, the semiconductor element can be driven using the highly conductive layer as the electrical path, thereby decreasing the driving voltage.

In the semiconductor apparatus of the present invention, the highly conductive layer is preferably at least either a high carrier density layer or a high carrier mobility layer to reduce the electric resistance of the highly conductive layer.

In the semiconductor apparatus of the present invention, the semiconductor element is preferably a compound semiconductor device and preferably has at least one of a light-emitting diode, a surface emitting laser, a photodetector, a photodiode, a field-effect transistor, a high electron mobility transistor, a bipolar transistor, a thyristor, an inductor, a capacitor, and a resistor.

In the semiconductor apparatus of the present invention, the semiconductor element is preferably a silicon semiconductor device and constitutes at least one of an integrated circuit, a photodiode, a transistor, and a diode.

In the semiconductor apparatus of the present invention, the semiconductor element is preferably a surface emitting laser having a pair of multilayer reflector structures. Preferably, the highly conductive layer is a high carrier mobility layer. More preferably, the high carrier mobility layer is disposed inside the multilayer reflector structure disposed at the semiconductor substrate or the predetermined substrate.

With this structure, the current path between the electrode and the semiconductor substrate or the predetermined substrate can be shortened since the high electron mobility layer is inside the multilayer reflector structure. Thus, the resistance of the semiconductor apparatus can be decreased.

In accordance with the present invention, the semiconductor unit is connected to a circuit of the predetermined substrate to form an integrated circuit.

The present invention provides an electrooptic apparatus including the above-described semiconductor apparatus.

The present invention provides an electronic apparatus including the above-described electrooptic apparatus.

The present invention provides a method of making a semiconductor unit, including: forming a functional layer including a semiconductor element, and a highly conductive layer on a surface of a semiconductor substrate; and separating the functional layer and the highly conductive layer placed on the semiconductor substrate from the semiconductor substrate.

According to this method, the highly conductive layer that reduces the resistance of the semiconductor unit can be formed at the same time with the semiconductor element. Furthermore, the semiconductor elements diced into micro tiles can be bonded on any workpiece to form an integrated circuit. The semiconductor element may be a compound semiconductor or a silicon semiconductor. The workpiece onto which the semiconductor element is bonded may be a silicon semiconductor substrate or a compound semiconductor substrate. According to the present invention, a semiconductor element, such as a GaAs surface emitting laser or a photodiode, composed of a material different from that of the semiconductor substrate can be formed on the substrate. Since the semiconductor element is prepared on a semiconductor substrate and then is formed into a micro tile, the semiconductor element can be tested and screened in advance prior to forming an integrated circuit.

The present invention also provides another method of making a semiconductor unit, including: forming a functional film including semiconductor element, and a highly conductive layer on a surface of a semiconductor substrate; bonding a film to the surface of the semiconductor substrate, the surface being provided with the semiconductor element; and separating the functional layer and the highly conductive layer from the semiconductor substrate.

According to this method, the highly conductive layer that reduces the resistance of the semiconductor unit can be formed at the same time with the semiconductor element. Furthermore, the functional film including the semiconductor element can be independently formed into a micro tile from the semiconductor substrate and may be mounted on a film to facilitate handling. Thus, the semiconductor element can be individually selected to be bonded on a final substrate, and the size of the semiconductor element to be handled can be reduced compared to the related art packaging technology.

In the method of making the semiconductor unit of the present invention, the semiconductor substrate preferably has a sacrificial layer disposed under the functional layer and the highly conductive layer, and the functional layer and the highly conductive layer are separated from the semiconductor substrate by etching away the sacrificial layer.

In the method of making the semiconductor unit of the present invention, a dicing groove is preferably formed in the semiconductor substrate, and the functional layer and the highly conductive layer are preferably separated from the semiconductor substrate by etching away the sacrificial layer.

In the method of making the semiconductor unit of the present invention, the functional layer is preferably bonded onto a substrate composed of at least one of silicon, quartz, glass, sapphire, metal, ceramic, or plastic.

According to this method, since the functional layer to be bonded on the substrate already includes the finished semiconductor element, no complicated semiconductor process is necessary after bonding. Since the substrate as a whole need not to be processed after the bonding of the functional layer to the substrate, the manufacturing process can be streamlined, and the requirements for the bonding method can be relaxed. For example, a bonding method using a low-heat-resistant material may be employed.

Preferably, in the method o making the semiconductor unit of the present invention, the semiconductor element bonded on the substrate is electrically connected to a circuit formed on the substrate.

DETAILED DESCRIPTION OF PREFERRED EMBODIMENTS

Exemplary structures of a semiconductor unit and a semiconductor apparatus of the present invention are described below with reference to FIGS. 1 to 6. First and second exemplary embodiments relate to bonding a compound semiconductor device (compound semiconductor element) on a silicon LSI chip. However, the present invention can be applied regardless of the type of semiconductor device or the type of LSI chip.

(First Exemplary Embodiment)

Figure 1:
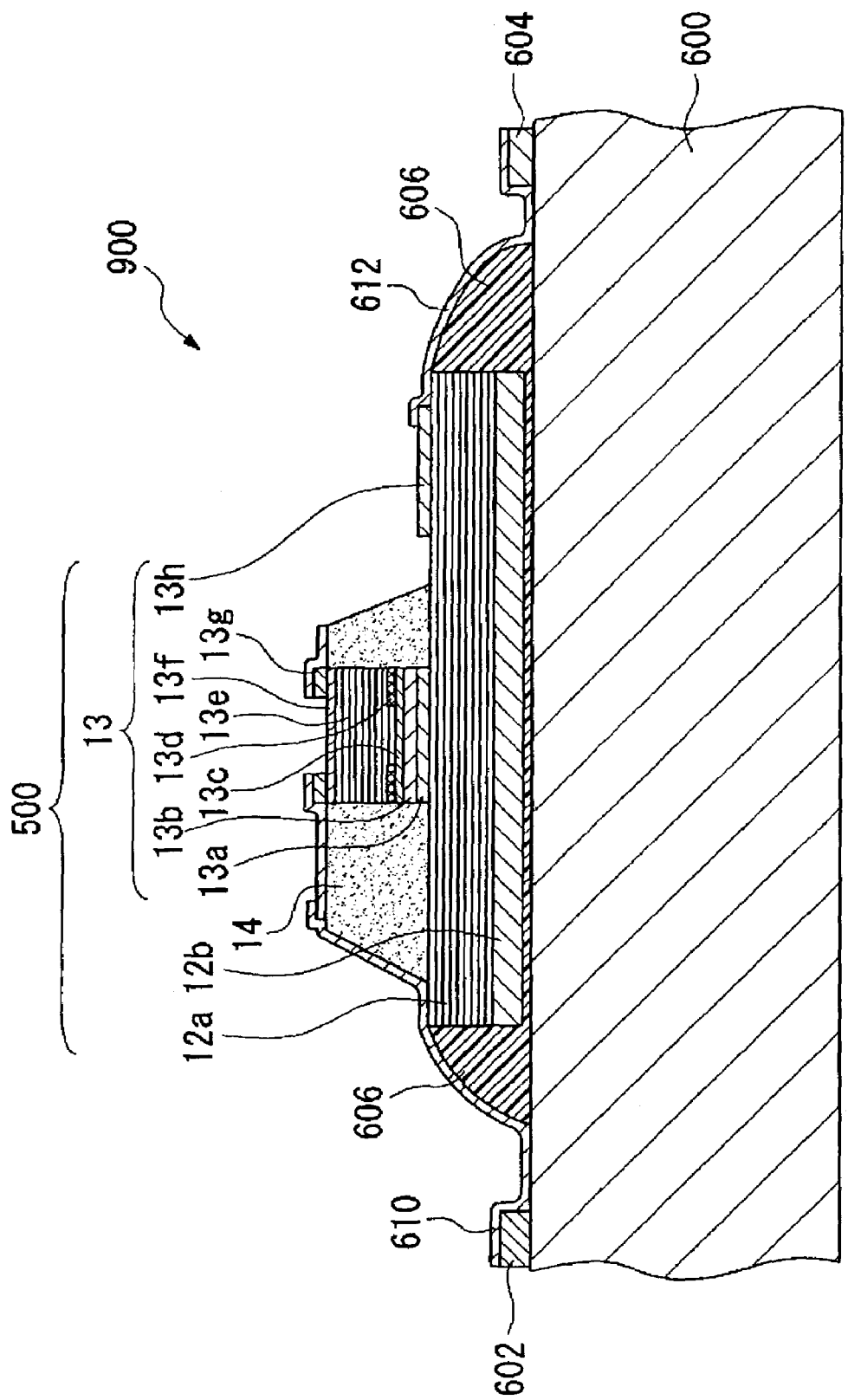
FIG. 1 is a cross-sectional view showing the structure of a semiconductor unit and a semiconductor apparatus according to a first exemplary embodiment.

FIG. 1 is a schematic cross-sectional view showing the structures of a semiconductor unit and a semiconductor apparatus according to a first exemplary embodiment of the present invention. In this exemplary embodiment, the semiconductor unit and the semiconductor apparatus constitute a surface emitting semiconductor laser. Referring to FIG. 1, a lower reflector composite structure (hereinafter, "a lower mirror") 12a is formed on the entire upper face of a highly conductive layer (high carrier density layer) 12b composed of an n-type gallium arsenide compound semiconductor (n-type GaAs layer). The highly conductive layer 12b has the shape of a rectangle in a plan view. Layers 13a to 13f are deposited in order from 13a to 13f on the lower mirror 12a to form a columnar mesa. An insulating layer 14 composed of polyimide or the like and electrodes 13g and 13h are provided around the mesa. The layers 13a to 13h and the lower mirror 12a form a functional layer, which functions as a surface emitting laser.

In the present invention, the term "functional layer" refers to a layer essential for exhibiting a desired function as a semiconductor element. For example, in order for it to function as a surface emitting laser described above, the "functional layer" must include an upper mirror 13e, the lower mirror 12a, and the semiconductor composite structure sandwiched by the upper mirror 13e and the lower mirror 12a. The functional layer may include components, such as a contact layer 13f, the electrodes 13g and 13h, and the insulating layer 14, having subsidiary functions. The functional layer and the high carrier density layer 12b form a semiconductor unit 500.

A method of making the semiconductor unit 500 will be described later. The mesa may be of any shape.

The structure of the mesa is described below. First, an n-type cladding layer (a lower cladding) 13a composed of n-type $Al_{0.5}Ga_{0.5}As$ is formed on the lower mirror 12a. An active layer 13b, a p-type cladding layer (an upper cladding) 13c composed of p-type $Al_{0.5}Ga_{0.5}As$, a ring-shaped horizontal oxide layer (current aperture) 13d provided at the outer periphery of the mesa, the upper mirror (upper reflector composite structure) 13e, and a contact layer 13f composed of p-type GaAs are sequentially deposited in that order on the n-type cladding layer (a lower cladding) 13a. The insulating layer 14 is then formed around the mesa, the p-type electrode (cathode) 13g is formed on the upper face of the contact layer 13f, and the n-type electrode (anode) 13h is formed on the upper face of lower mirror 12a. A voltage is applied between the electrodes, and a laser beam is emitted from the upper end of the mesa in the axis direction of the mesa. The cathode 13g is ring-shaped, and the laser beam is emitted from the center of the mesa.

The highly conductive layer 12b decreases the electric resistance of the semiconductor unit by securing the current path. The highly conductive layer 12b is a high carrier density layer of the same conductivity type as the lower mirror 12a and has a carrier density of approximately 5 to $10 \times 10^{18}$ cm$^{-3}$. The highly conductive layer 12b is preferably composed of GaAs but may be composed of $Al_xGa_{1-x}As$, wherein X is 0.2 or less. However, the layer composed of $Al_xGa_{1-x}As$ tends to undergo an increase in resistance as X increases. The thickness of the highly conductive layer 12b is preferably at least 0.3 μm, and more preferably at least 1 μm.

The active layer 13b has a multiquantum well structure constituted from GaAs well sublayers and $Al_{0.3}Ga_{0.7}As$ barrier sublayers, the number of the GaAs well sublayers being three.

The mirrors 12a and 13e reflect a laser beam and constitute a resonator. For example, each mirror is a distributed Bragg reflector mirror (DBR mirror) formed by alternately stacking two types of $Al_xGa_{1-x}As$ layers having different compositions. In this exemplary embodiment, the lower mirror 12a is formed by alternately stacking n-type $Al_{0.15}Ga_{0.85}As$ sublayers and n-type $Al_{0.9}Ga_{0.1}As$ sublayers, approximately thirty of each. The upper mirror 13e is formed by alternately stacking p-type $Al_{0.15}Ga_{0.85}As$ sublayers and p-type $Al_{0.9}Ga_{0.1}As$ sublayers, approximately twenty five of each. Each $Al_xGa_{1-x}As$ layer has an optical thickness equal to one-fourth the laser emission wavelength and a carrier density of approximately 1 to $5 \times 10^{18}$ cm$^{-3}$. The upper mirror 13e is doped with carbon and is of a p-type. The lower mirror 12a is doped with silicon and is of n-type. Accordingly, the upper mirror 13e, the impurity-free active layer 13b, and the lower mirror 12a constitute a PIN diode. Alternatively, the conductivity type of the upper and the lower mirrors may be reversed depending on the polarity of the laser. Moreover, the semiconductor composite film may be replaced with a dielectric composite film or a metal thin film.

The current aperture 13d is composed of an insulating material primarily containing aluminum oxide. The current aperture 13d decreases the area of the light-emitting active region so as to decrease the threshold current and the beam width.

Figure 2:
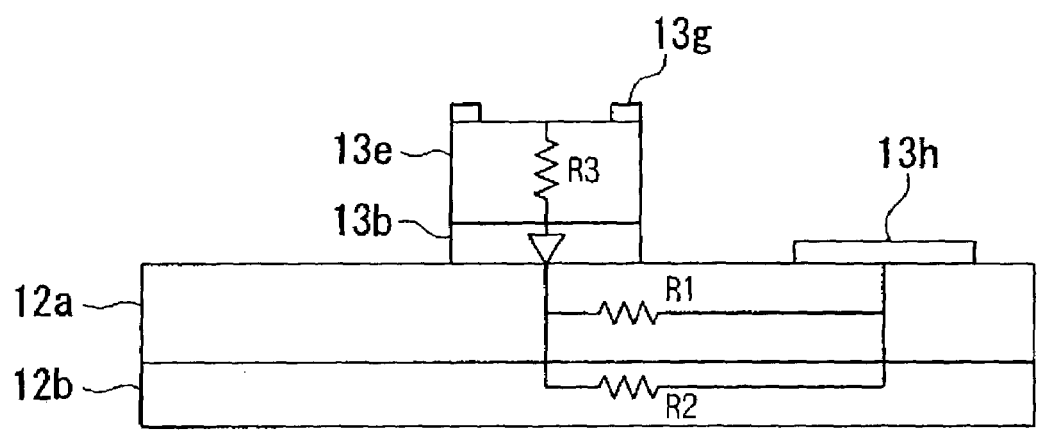
FIG. 2 is a schematic showing a current path inside the semiconductor unit.

The current path of the semiconductor unit 500 having the above-described structure is shown in FIG. 2.

As shown in FIG. 2, an electric circuit including a resistor R3 of the upper mirror 13e, a resistor R1 of the lower mirror 12a, and a resistor R2 of the high carrier density layer 12b are connected between the electrodes 13g and 13h to form an electric current. An electric current flows in this circuit. Since the resistors R1 and R2 connected in parallel can be regarded as a combined resistor R, the electric circuit has the resistors R and R3 connected in series.

In this exemplary embodiment, the resistivity of the lower mirror (30 pairs of DBR mirrors, carrier density: $5 \times 10^{18}$ cm$^{-3}$) is approximately $1.1 \times 10^{-2}$ Ωcm; accordingly, R1=20 Ω when the thickness is 3 μm. The resistivity of the high carrier density layer (n-GaAs layer, carrier density: $1 \times 10^{19}$ cm$^{-3}$) is approximately $1.3 \times 10^{-3}$ Ωcm; accordingly, R2=6.7 Ω when the thickness is 1 μm and R2=3.35 Ω when the thickness is 2 μm. Since the resistors R1 and R2 are connected in parallel, the combined resistance R is 5.0 Ω when the thickness of the high carrier density layer is 1 μm and is 2.9 Ω when the thickness of the high carrier density layer is 2 μm. These values are one-fourth to one-sixth the value when only the lower mirror layer is provided without any high carrier density layer. Thus, the electric resistance in the semiconductor unit 500 is low.

When the carrier density of the lower mirror 12a is increased to approximately $1 \times 10^{19}$ cm$^{-3}$ so as to have conductive properties, the light absorption loss becomes high and performance (optical characteristics) as a reflector is degraded. In this exemplary embodiment, a high carrier density layer, which exhibits high conductivity and a large optical absorption coefficient and which affects the optical characteristics, is disposed under the lower mirror as viewed from the active layer, i.e., is disposed at a region outside the emission beam path of the laser light. This reduces or prevents degradation of the optical characteristics.

The position of the high carrier density layer depends on how it affects the characteristics of the semiconductor element. The position is not limited to the above-described position. For example, the high carrier density layer may be formed inside the functional layer.

The thickness of the functional layer is, for example, approximately 1 to 10 μm. A semiconductor element may be made in the functional layer. Examples of the semiconductor element include light-emitting diodes (LEDs), surface emitting lasers (VCSELs), photodiodes (PDs), high electron mobility transistors (HEMTs), and heterojunction bipolar transistors (HBTs). These semiconductor elements are each formed by epitaxially depositing many layers on a predetermined substrate. Each semiconductor element is provided with electrodes and undergoes operation test.

The semiconductor unit is separated from the substrate according to a method described below and is worked into a predetermined shape, e.g., a micro tile. The semiconductor unit preferably has, for example, a thickness of 1 to 8 μm and a size of several ten micrometers by several hundred micrometers.

The semiconductor units 500 formed into a micro tile can be bonded onto another substrate (final substrate) so as to make an integrated circuit, such as an OEIC. The structure of an integrated circuit (semiconductor apparatus) 900 is described below with reference to FIG. 1.

Referring to FIG. 1, the semiconductor unit 500 separated from the initial substrate is attached (bonded) onto a silicon substrate 600 through a bonding layer 606. A cathode 602 and an anode 604 are disposed on the surface of the silicon substrate 600. The electrode 13g is connected to the cathode 602 via a lead 610 on the surface, and the electrode 13h is connected to the anode 604 via a lead 612 on the surface to form the integrated circuit (semiconductor apparatus) 900. According to this exemplary embodiment, it is possible to form a micro semiconductor element (micro element tile) having the same size as a monolithically made semiconductor element on a substrate. The substrate may be of any type. Examples of the substrate include silicon, quartz, sapphire, metal, and ceramic substrates, and plastic films.

(Second Exemplary Embodiment)

Figure 3:
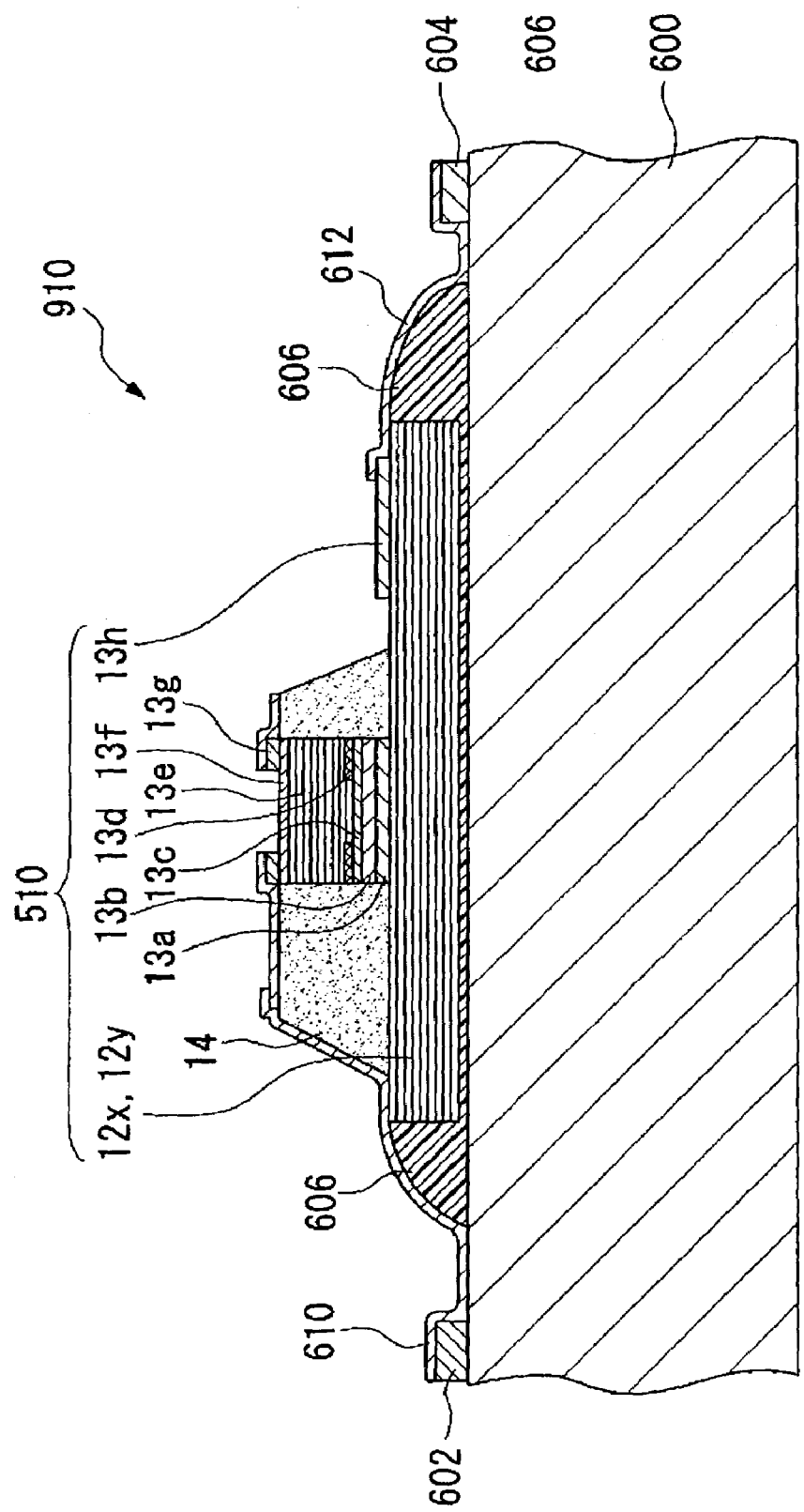
FIG. 3 is a cross-sectional view showing the structure of a semiconductor unit and a semiconductor apparatus according to a second exemplary embodiment.

FIG. 3 is a schematic cross-sectional view showing the structure of a surface emission semiconductor laser according to a second exemplary embodiment of the present invention. The surface emission semiconductor laser includes a semiconductor unit and a semiconductor apparatus. In this exemplary embodiment, the same components as the first exemplary embodiment are represented by the same reference numerals in the drawings, and the explanations thereof are omitted.

A semiconductor unit 510 differs from the semiconductor unit 500 in that a highly conductive layer 12y is disposed inside a lower mirror 12x. In other words, in this exemplary embodiment, the highly conductive layer is placed inside the functional layer. The semiconductor layers 13a to 13f are stacked in that order on the lower mirror 12x so as to form a mesa, and the semiconductor unit 510, as a whole, functions as a surface emitting laser, as with the semiconductor unit 500 described above. The semiconductor unit 510 is bonded onto the silicon substrate 600 via the bonding layer 606. The electrode 13g is connected to the cathode 602 via a lead 610 on the surface, and the electrode 13h is connected to the anode 604 via a lead 612 on the surface to form an integrated circuit (semiconductor apparatus) 910, as with the foregoing embodiment described above. The detailed description thereof is omitted.

This exemplary embodiment is provided such that the highly conductive layer 12y is placed inside the lower mirror 12x. The structure of the lower mirror 12x is described below with reference to FIG. 4.

Figure 4:
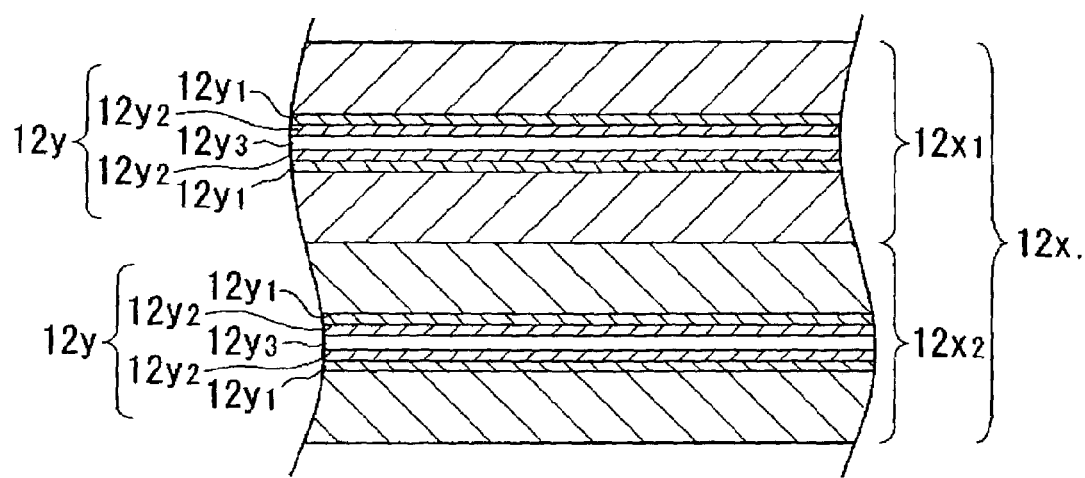
FIG. 4 is an enlarged cross-sectional view showing the structure of a lower mirror 12x containing highly conductive layer 12y inside.

Referring to FIG. 4, the lower mirror 12x and the upper mirror 13e function as laser beam reflectors. The lower mirror 12x is, for example, a distributed Bragg reflector mirror (DBR mirror) formed by alternately stacking two types of $Al_xGa_{1-x}As$ layers having different compositions. In this embodiment, the lower mirror 12x is formed by alternately stacking n-type $Al_{0.15}Ga_{0.85}As$ sublayers 12x1 and n-type $Al_{0.9}Ga_{0.1}As$ sublayers 12x2, approximately thirty of each. Each $Al_xGa_{1-x}As$ sublayer has a thickness equal to one fourth of the laser emission wavelength and a carrier density of approximately 1 to $5 \times 10^{18}$ cm$^{-3}$ and includes the highly conductive layer 12y inside.

The highly conductive layer 12y is a high carrier (electron) mobility layer. The highly conductive layer 12y is formed by stacking, in the following order, an electron supply sublayer 12y1, a hetero gap sublayer 12y2, an active sublayer (carrier transit sublayer) 12y3, another hetero gap sublayer 12y2, and another electron supply sublayer 12y1. Free electrons generated at the electron supply sublayers 12y1, which are the outermost layers, move into the surface layers (secondary electron gas layers) of the active sublayer (carrier transit sublayer) 12y3, which has the lowest energy potential, via the hetero gap sublayers 12y2. The free electrons can two-dimensionally move in these surface layers at a high mobility.

The active sublayer 12y3 is composed of, for example, undoped GaAs and has an impurity concentration of approximately $1 \times 10^{14}$ cm$^{-3}$. Carriers are confined in the active layer by hetero bonding between the hetero gap sublayers 12y2 and the active sublayer 12y3. The hetero gap sublayers 12y2 are each composed of, for example, lightly doped $Al_xGa_{1-x}As$ (X=0.3) and have an impurity concentration of approximately $1 \times 10^{14}$ to $1 \times 10^{15}$ cm$^{-3}$. The electron supply sublayers 12y1 for generating carriers (free electrons or the like) are composed of, for example, highly doped $Al_xGa_{1-x}As$ (X=0.3) and have an impurity concentration of approximately $1 \times 10^{18}$ cm$^{-3}$.

Since the above-described two-dimensional electron gas layers are inside the GaAs layer, Coulomb scattering of electrons due to ionized donors can be prevented, and the two-dimensional electron gas layers have a high mobility (approximately 8,600 cm$^2$/V·S). While the electric resistance or the semiconductor is determined by (carrier mobility)×(carrier concentration), the electric resistance of the highly conductive layer 12y is low since both the mobility and the concentration of electrons are high in the two-dimensional electron gas layers.

Figure 5:
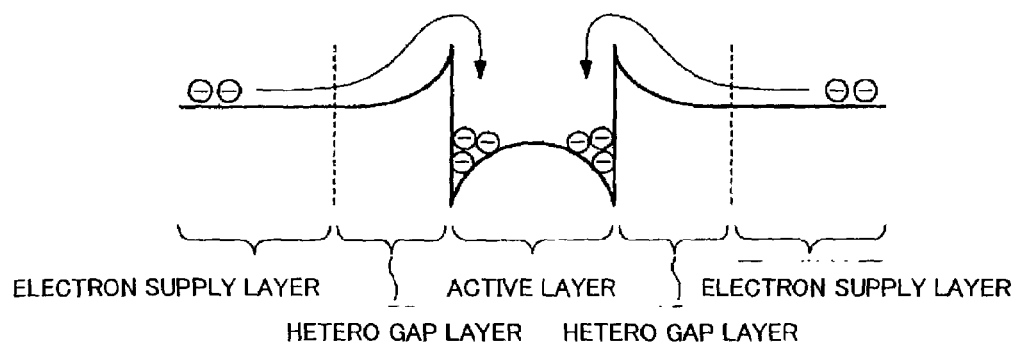
FIG. 5 is a schematic showing the band profile of the highly conductive layer 12y.

FIG. 5 shows a band profile in the high carrier mobility layers. As can be understood from FIG. 5, the free electrons generated in the electron supply layers are transferred to the surface of the active layer through the hetero gap layers and are confined thereat, thereby forming a two-dimensional electron gas layer.

As described above, when the high carrier mobility layers have a low resistance, the combined resistance of the resistance of the lower mirror 12x and the resistance of the high carrier mobility layer 12y connected in parallel can be decreased, based on the same principle described above with reference to FIG. 3. Thus, the resistance of the semiconductor unit 510 is decreased.

In the above-described exemplary embodiment, the thickness of the high carrier mobility layer 12y is small, i.e., approximately 20 nm, whereas the total of the thickness of the n-type $Al_{0.15}Ga_{0.85}As$ sublayer 12x1 and the thickness of the n-type $Al_{0.9}Ga_{0.1}As$ sublayer 12x2 is approximately 120 nm. Thus, it is possible to place the highly conductive layer 12y inside the n-type $Al_{0.15}Ga_{0.85}As$ sublayer 12x1 or the n-type $Al_{0.9}Ga_{0.1}As$ sublayer 12x2. However, in this manner, the optical characteristic (the effective refractive index) of each of the n-type $Al_{0.15}Ga_{0.85}As$ sublayer 12x1 and the n-type $Al_{0.9}Ga_{0.1}As$ sublayer 12x2 changes, thereby affecting the performance as the reflectors. Thus, the thickness of the sublayer 12x1 and the sublayer 12x2 should be properly controlled to correct the effective refractive index and to achieve the reflector function.

Alternatively, the high carrier mobility layer 12y may be placed inside only one of the sublayers 12x1 and 12x2, and may be placed at the top or the bottom of the lower mirror 12x. However, when the high carrier mobility layer 12y is formed at the bottom of the lower mirror 12x, the current path is extended since the current flows into the high carrier mobility layer 12y after passing through the lower mirror 12x around the electrode 13h. Thus, the high carrier mobility layer 12y is preferably placed inside the lower mirror 12x.

(Third Exemplary Embodiment)

Figure 6:
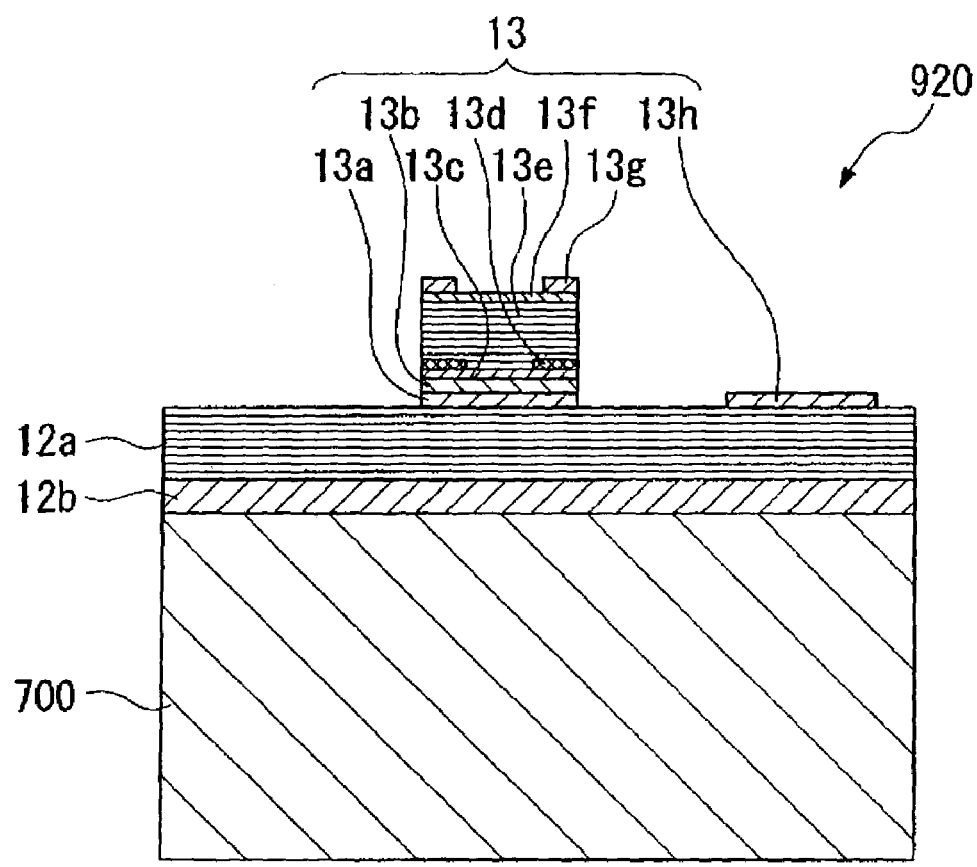
FIG. 6 is a cross-sectional view showing the structure of a semiconductor apparatus according to a third exemplary embodiment of the present invention.

FIG. 6 is a schematic cross-sectional view showing the structure of a semiconductor apparatus according to a third exemplary embodiment. In this exemplary embodiment, the same components as in first exemplary embodiment are represented by the same reference numerals in the drawings, and the explanation thereof is omitted.

Referring now to FIG. 6, the highly conductive layer 12b, the lower mirror 12a, and the semiconductor layers 13a to 13f are sequentially stacked on a semiconductor substrate 700 in that order. These layers and the electrodes 13g and 13h constitute a semiconductor apparatus 920. In other words, this exemplary embodiment differs from the semiconductor unit 500 in that a semiconductor element 13 and the highly conductive layer 12b are epitaxially deposited on the semiconductor substrate 700. The rest of the structure is the same. The semiconductor substrate 700 is a common GaAs substrate having a thickness of several ten to several hundred micrometers. In order to reduce or prevent crosstalk between a plurality of functional layers arranged in arrays on the substrate, the semiconductor substrate 700 has a semi-insulating property. The semi-insulating property can be rendered by forming defects in crystals of the substrate. Alternatively, an insulating layer may be provided between the highly conductive layer 12b and the semiconductor substrate 700 having no semi-insulating property. The present invention can be applied to such a case.

In this exemplary embodiment also, the highly conductive layer 12b, which is the high carrier density layer, reduces the resistance of the substrate as a whole based on the same principle as that previously explained with reference to FIG. 3 since the resistance of the substrate as a whole is determined from the resistance of the highly conductive layer 12b and the resistance of the lower mirror 12a connected in parallel. The high carrier mobility layer of the second exemplary embodiment may be used as the highly conductive layer 12b. In this case, the high carrier mobility layer may be placed inside the composite film that constitutes the lower mirror 12a. Leads (not shown) and the like are then formed on the semiconductor apparatus 920 alone or with a predetermined substrate bonded thereto.

The present invention is particularly effective when all of the electrodes to drive the semiconductor element are formed at the upper surface of the functional layer. In the first and second exemplary embodiments, the lower surface of the functional at the lower-mirror-12a side is bonded to the other substrate 600 via the bonding layer 606. Thus, when driving electrodes are formed at the silicon-substrate-600 side, the electric current does not smoothly flow between the silicon substrate 600 and the functional layer. Even when the bonding layer 606 is made to have conducting properties, the electric current does not flow smoothly due to the presence of the Schottky barrier. In the third exemplary embodiment, since the conductive property of the semiconductor substrate is low, it is not practical to form driving electrodes at the semiconductor-substrate side.

In the semiconductor unit and the semiconductor apparatus of the present invention, the highly conductive layer may be a composite of different types of layers. For example, both the high carrier density layer and the high carrier mobility layer may be formed.

No particular limit is imposed on the method for making the semiconductor unit and the semiconductor apparatus of the present invention. Any related art, later developed or known method may be employed. For example, the layers may be deposited on a predetermined substrate by metal organic chemical vapor deposition (MOCVD) or the like and may be etched in the thickness direction by plasma etching or the like after a mask is formed with a suitable photoresist so as to form the mesa structure of the surface emitting laser. The current aperture may be formed by oxidizing the mesa constituted from AlGaAs layers from outside into a ring shape. In making the semiconductor unit, however, the following method is preferable.

(Fourth Exemplary Embodiment)

A method of making the semiconductor unit and the semiconductor apparatus according to a fourth exemplary embodiment of the present invention are described below with reference to FIGS. 7 to 16. In the fourth exemplary embodiment, bonding of a compound semiconductor device (compound semiconductor element) on a silicon LSI chip is described. However, the present invention can be applied regardless of the type of semiconductor device or LSI chip. In this exemplary embodiment the term "semiconductor substrate" refers to an article composed of a semiconductor material and is not limited to a tabular substrate. Any semiconductor article of any shape is included in the meaning of "semiconductor substrate".

<Step 1>

Figure 7:
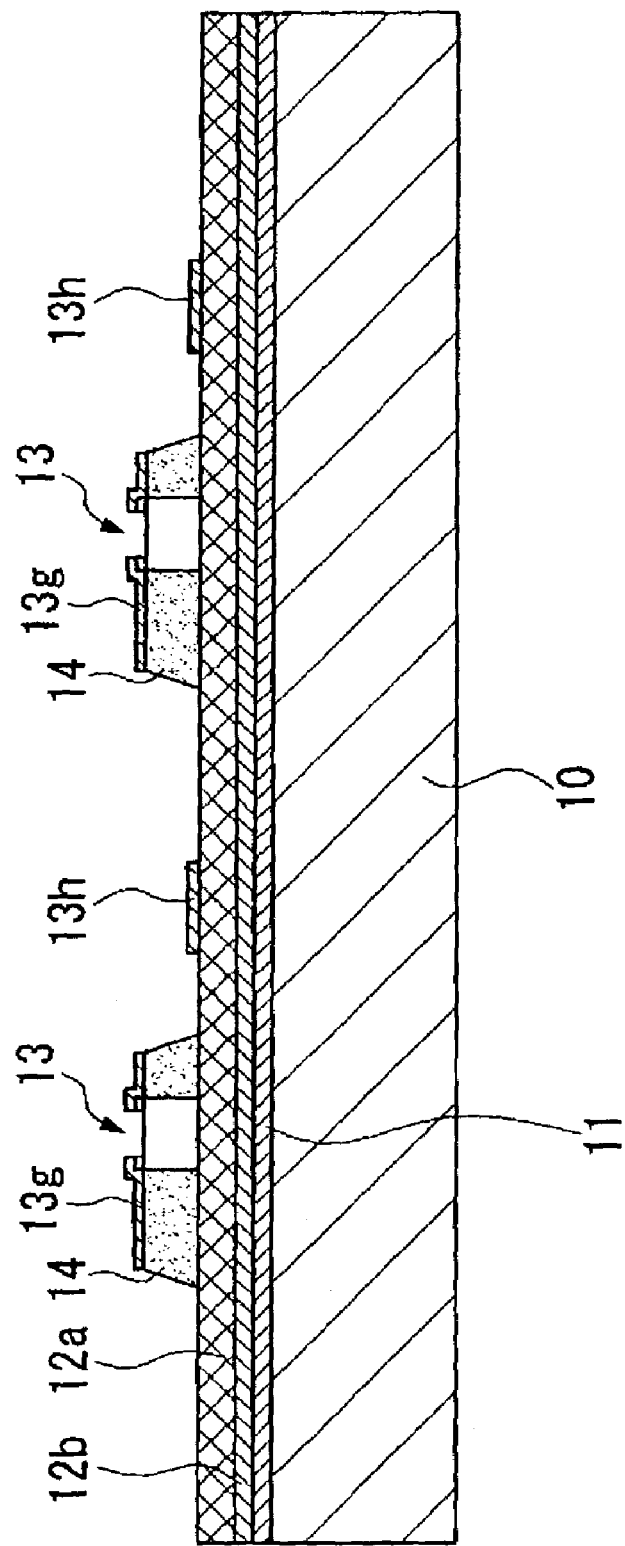
FIG. 7 is a schematic cross-sectional view showing Step 1 of a method of making a semiconductor unit and a semiconductor apparatus according to a fourth exemplary embodiment.

FIG. 7 is a schematic cross-sectional view of Step 1 of the method of making the semiconductor unit and the semiconductor apparatus according to this exemplary embodiment. In this exemplary embodiment, the semiconductor unit 500 of the first exemplary embodiment is made. Referring to FIG. 7, a substrate 10 is a GaAs compound semiconductor substrate in this exemplary embodiment. A sacrificial layer 11 is formed on the substrate 10. The sacrificial layer 11 is composed of aluminum arsenide (AlAs) and has a thickness of, for example, several hundred nanometers.

For example, the highly conductive layer 12b is formed on the sacrificial layer 11, and the lower mirror 12a is formed on the highly conductive layer 12b. The above-described mesa 13 may be formed on the lower mirror 12a. The highly conductive layer 12b, the lower mirror 12a, and the mesa 13 are formed by epitaxially depositing layers on the substrate 10 to prepare the element.

Any related art, later developed, or known method, such as MOCVD or etching, may be employed to form the sacrificial layer 11, the highly conductive layer 12b, the lower mirror 12a, and the mesa 13.

<Step 2>

Figure 8:
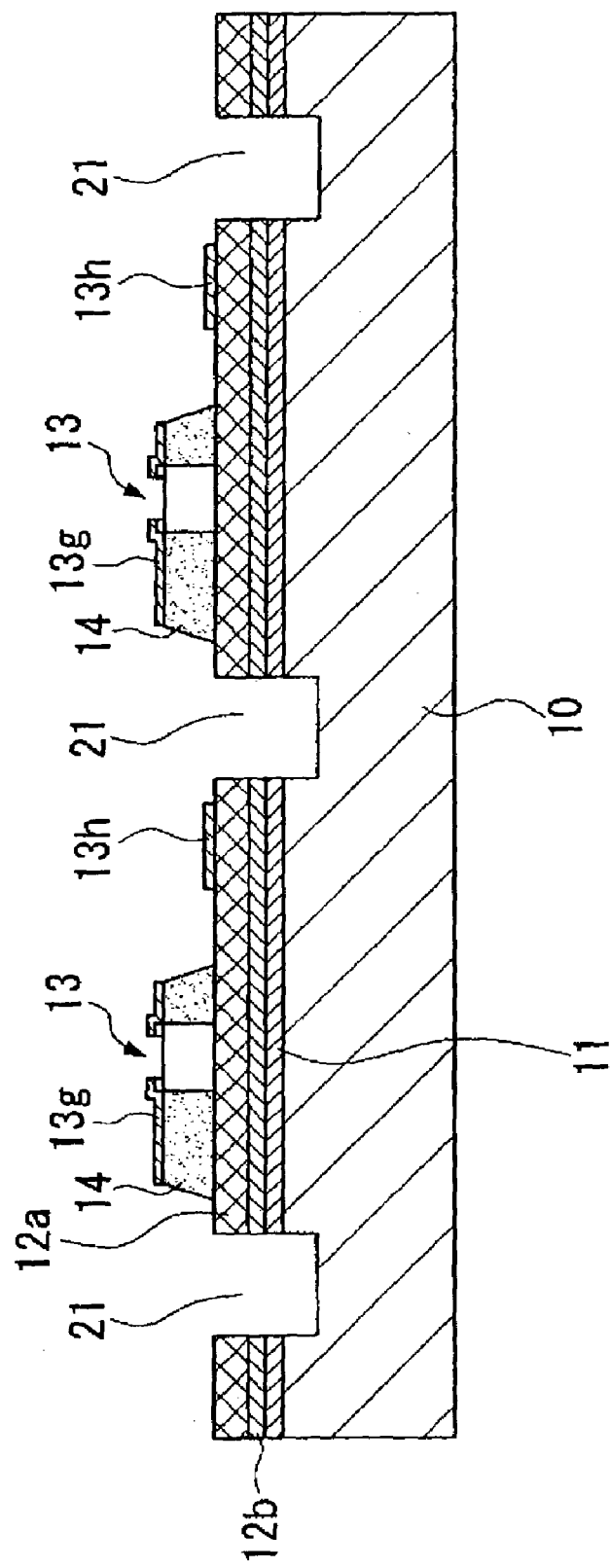
FIG. 8 is a schematic cross-sectional view showing Step 2 of the above-described fabrication method.

FIG. 8 is a schematic cross-sectional view showing Step 2 of the method of making the semiconductor unit and the semiconductor apparatus according to this exemplary embodiment. In this step, dicing grooves 21 are formed to separate semiconductor units 500 from each other. The depth of the dicing grooves 21 must be large enough to at least reach the sacrificial layer 11. For example, the width and the depth of the dicing grooves 21 are 10 µm to several hundred micrometers. The dicing grooves 21 should be connected to each other without any dead ends so that a selective etchant described below can flow in the dicing groove 21. The dicing grooves 21 are preferably formed into a grid such as a checkerboard.

The intervals between the dicing grooves 21 are preferably several ten to several hundred micrometers so that each of the semiconductor units 500 separated by the dicing grooves 21 has an area of several ten square micrometers to several hundred square micrometers. The dicing grooves 21 may be formed by a combination of photolithography and wet etching or by dry etching. The dicing groove 21 may be formed by U-shaped groove dicing to an extent that does not generate cracks in the substrate.

In forming the dicing grooves 21, a sulfuric-acid-based etchant may be used in wet etching and chlorine gas may be used in dry-etching. The pattern of forming the dicing grooves 21 is large and does not require stringent accuracy. Thus, the etching mask need not be formed by photolithography. For example, the etching mask may be formed by offset printing. In forming the dicing grooves 21, the direction of the dicing grooves 21 relative to the crystal orientation of the substrate 10 is also important.

Figure 9:
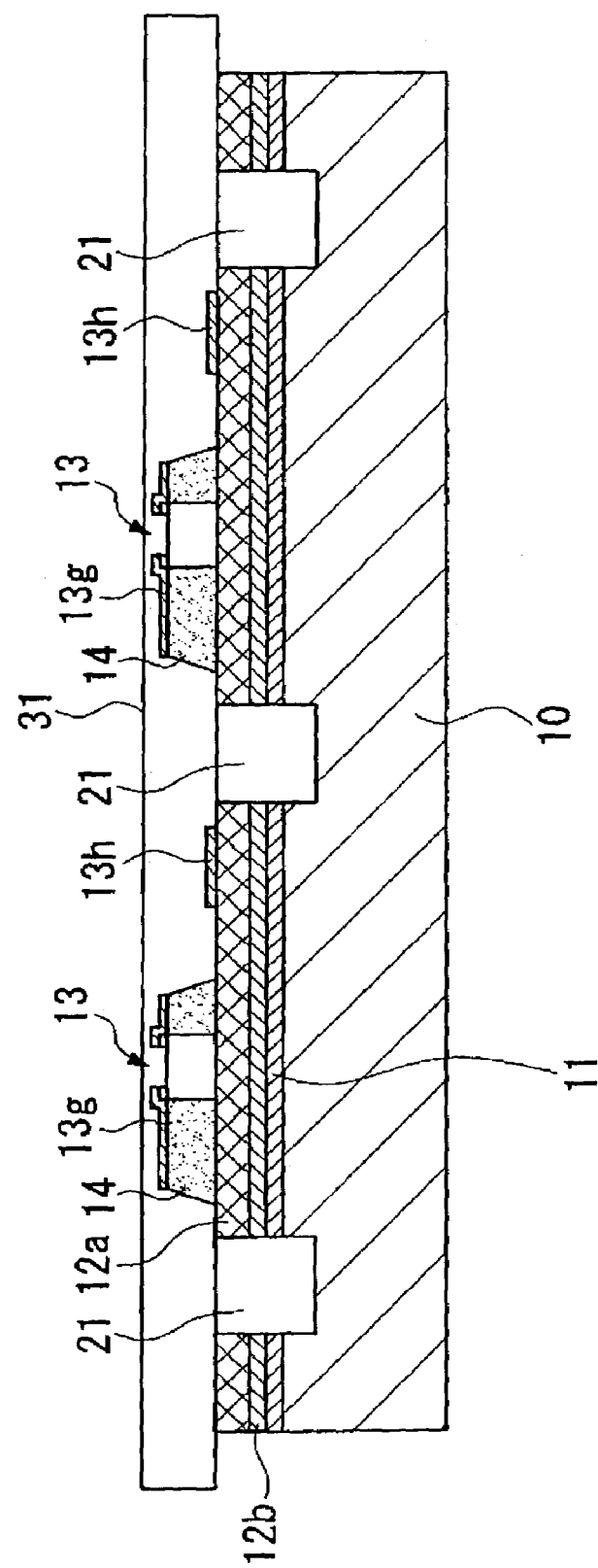
FIG. 9 is a schematic cross-sectional view showing Step 3 of the above-described fabrication method.

<Step 3>
FIG. 9 is a schematic cross-sectional view showing Step 3 of the method of making the semiconductor unit and the semiconductor apparatus of this exemplary embodiment. In this step, an intermediate transfer film 31 is applied on the surface (the semiconductor-device-13-side surface) of the substrate 10. The intermediate transfer film 31 is a flexible strip of film with an adhesive applied on the surface.

Figure 10:
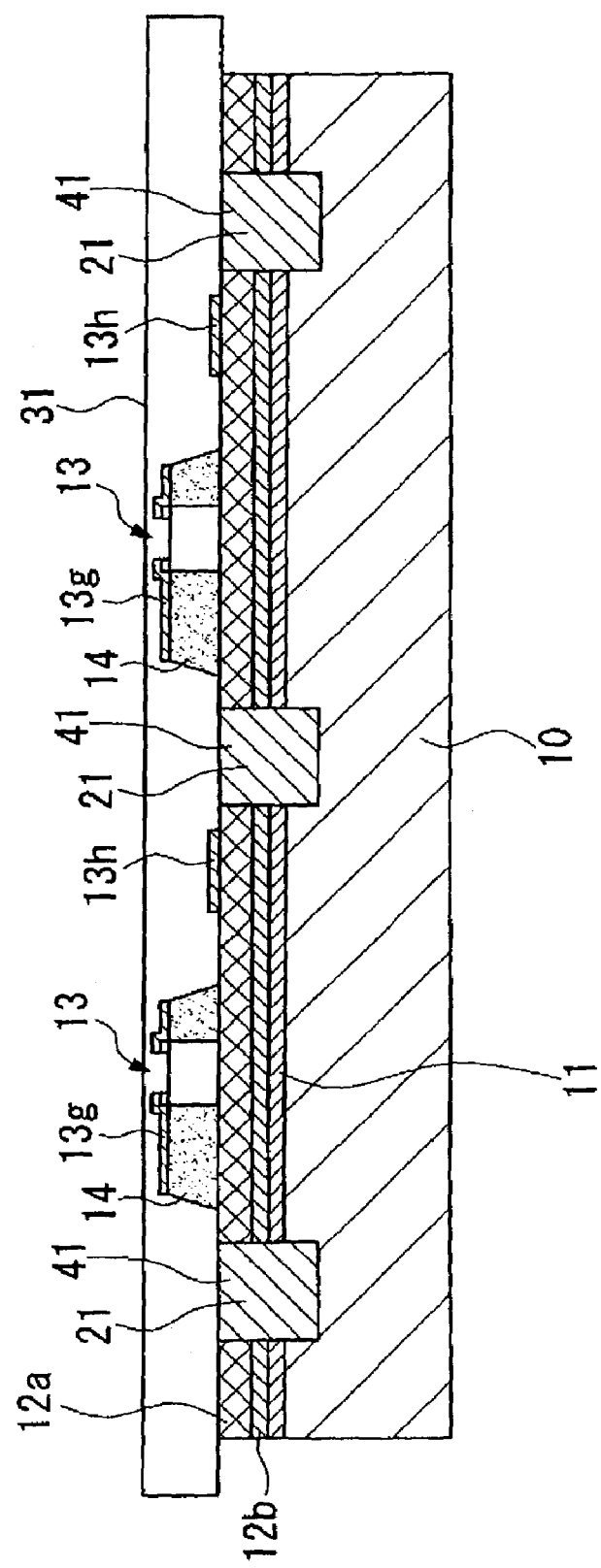
FIG. 10 is a schematic cross-sectional view showing Step 4 of the above-described fabrication method.

<Step 4>
FIG. 10 is a schematic cross-sectional view of Step 4 of the method of making the semiconductor unit and the semiconductor apparatus according to this exemplary embodiment. In this step, a selective etchant 41 is fed into the dicing grooves 21. In this step, in order to selectively etch only the sacrificial layer 11, dilute sulfuric acid highly selective to aluminum arsenide is used as the selective etchant 41. Dilute hydrofluoric acid may also be used as the selective etchant 41, but sulfuric acid is preferred from the viewpoint of selectivity.

Figure 11:
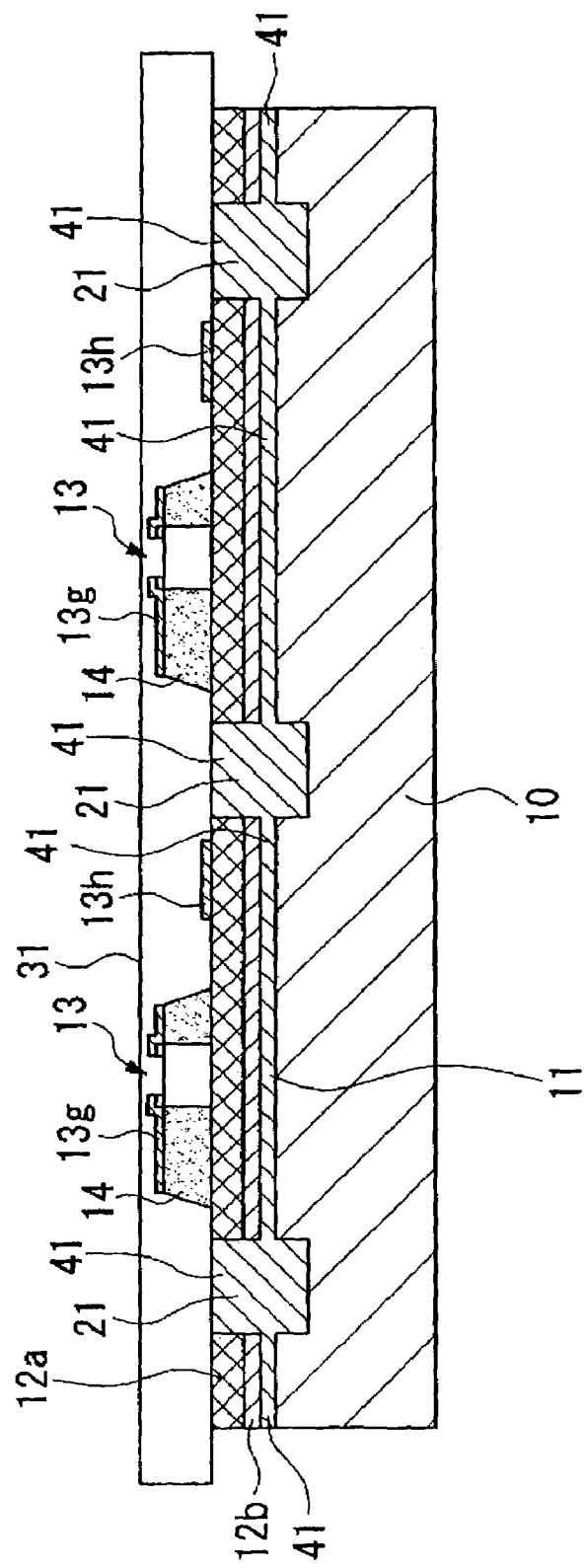
FIG. 11 is a schematic cross-sectional view showing Step 5 of the above-described fabrication method.

<Step 5>
FIG. 11 is a schematic cross-sectional view showing Step 5 of the method of making the semiconductor unit and the semiconductor apparatus according to this exemplary embodiment. In this step, the entire sacrificial layer 11 is removed by selective etching after a predetermined time has elapsed since the feeding of the selective etchant 41 to the dicing grooves 21 in Step 4. Subsequently, the dicing grooves 21 and the void where the sacrificial layer 11 was previously formed are rinsed with deionized water.

Figure 12:
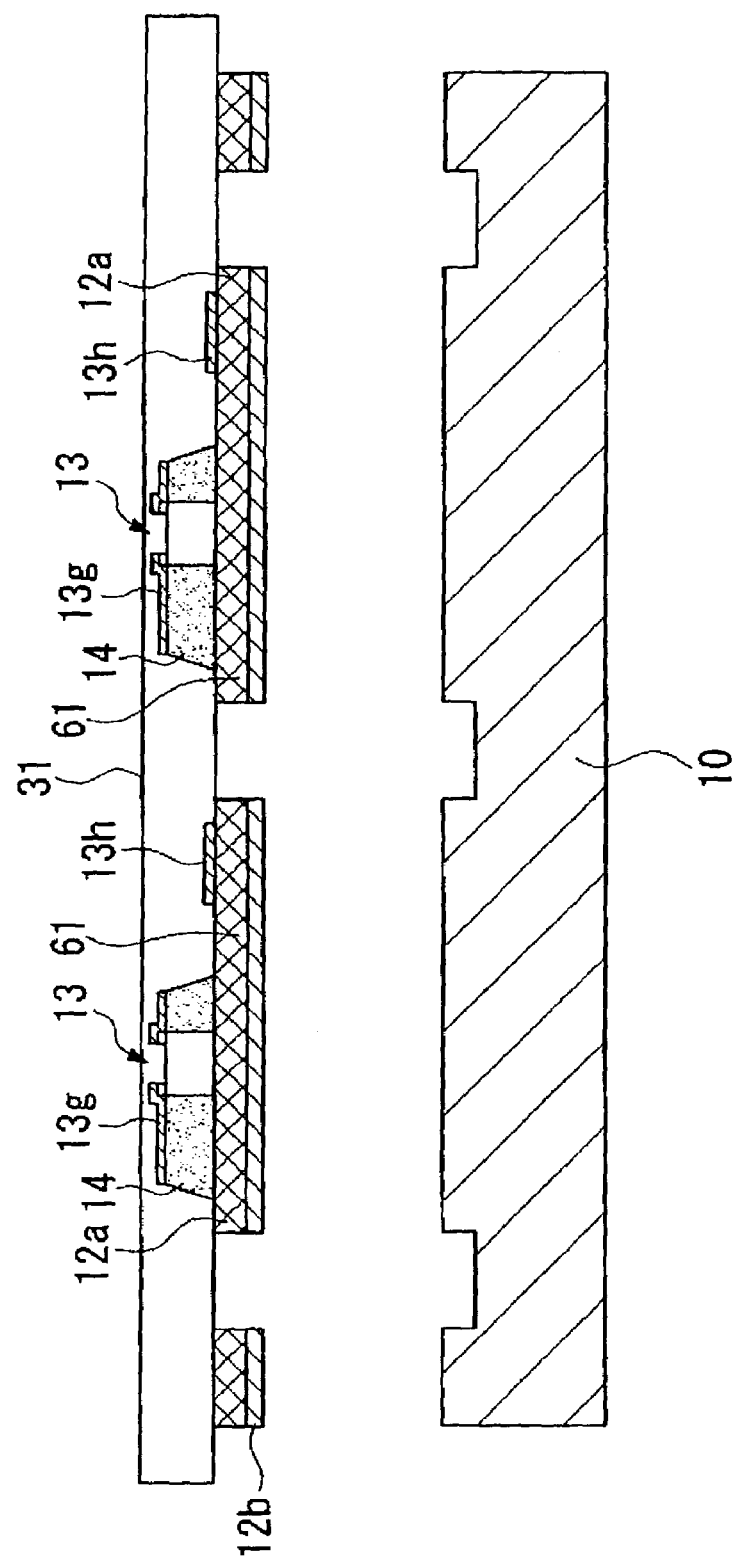
FIG. 12 is a schematic cross-sectional view showing Step 6 of the above-described fabrication method.

<Step 6>
FIG. 12 is a schematic cross-sectional view showing Step 6 of the method of making the semiconductor unit and the semiconductor apparatus according to this exemplary embodiment. By etching away the entire sacrificial layer 11 in Step 5, the mesa 13, the lower mirror 12a, and the highly conductive layer 12b become separated from the substrate 10. In this step, the intermediate transfer film 31 is pulled away from the substrate 10 so as to separate the functional layer (the mesa 13 and the lower mirror 12a) and the highly conductive layer 12b, which are attached to the intermediate transfer film 31, from the substrate 10.

As a result, the semiconductor unit 500 becomes a micro element tile 61 supported by and attached to the intermediate transfer film 31. At this stage, the thickness of the functional layer is preferably 1 to 8 μm and several tens micrometers to several hundred micrometers in length and width.

Moreover, the substrate 10 after the separation of the semiconductor units 500 (the micro element tiles 61) can be reused to form semiconductor devices. By preliminarily forming a plurality of sacrificial layers 11, Steps 1 to 6 can be repeated. The substrate 10 can be reused to repetitively form the micro element tiles 61.

Figure 13:
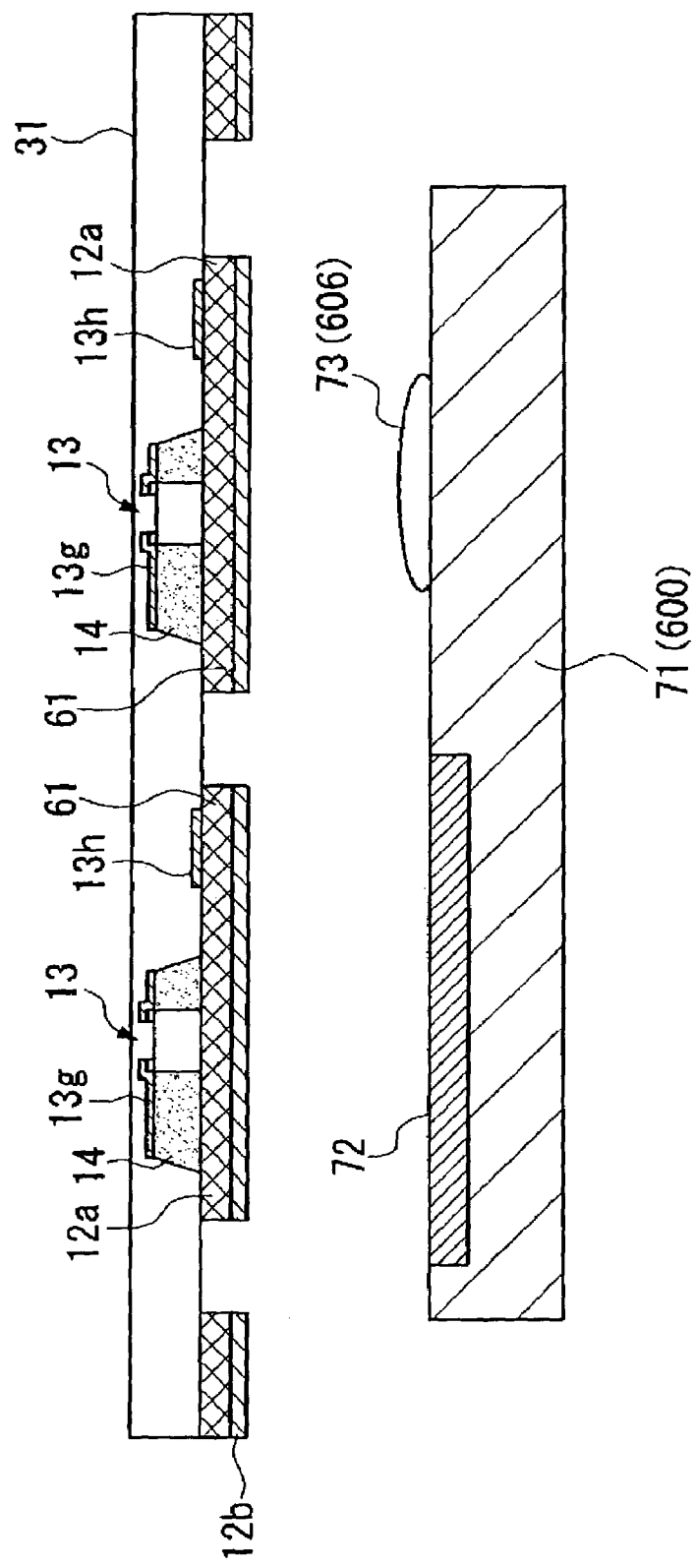
FIG. 13 is a schematic cross-sectional view showing Step 7 of the above-described fabrication method.

<Step 7>
FIG. 13 is a schematic cross-sectional view showing Step 7 of the method of making the semiconductor unit and the semiconductor apparatus according to this exemplary embodiment. In this step, the intermediate transfer film 31 (with the micro element tiles 61 attached thereto) is moved to align the micro element tile 61 to a predetermined position of a final substrate 71 (the substrate 600 in FIG. 1). The final substrate 71 is composed of a silicon semiconductor and includes an LSI region 72. An adhesive 73 to bond the micro element tile 61 is applied on the predetermined position of the final substrate 71.

Figure 14:
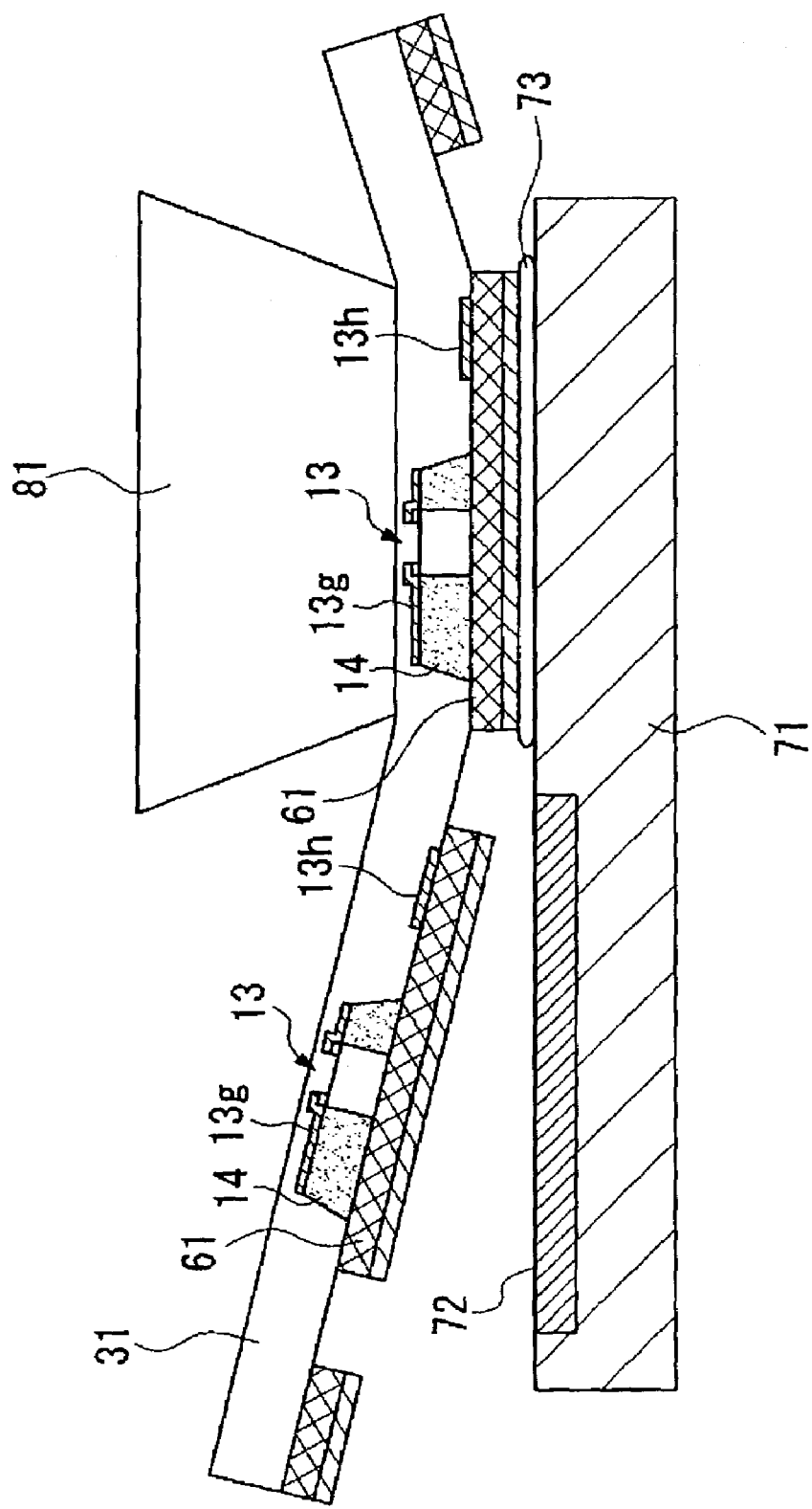
FIG. 14 is a schematic cross-sectional view showing Step 8 of the above-described fabrication method.

<Step 8>
FIG. 14 is a schematic cross-sectional view showing Step 8 of the method of making the semiconductor unit and the semiconductor apparatus according to this exemplary embodiment. In this step, the micro element tile 61 aligned to the predetermined position of a final substrate 71 is bonded to the final substrate 71 by applying pressures using a collet 81 through the intermediate transfer film 31. Since the adhesive 73 is applied to the predetermined position, the micro element tile 61 can be bonded at the predetermined position of the final substrate 71. In this manner, a semiconductor apparatus including a semiconductor unit (micro tile element 61) attached on the final substrate 71 is made.

Although an adhesive is used to bond the micro element tile 61 to the final substrate 71 in this step, other bonding means may be employed.

Figure 15:
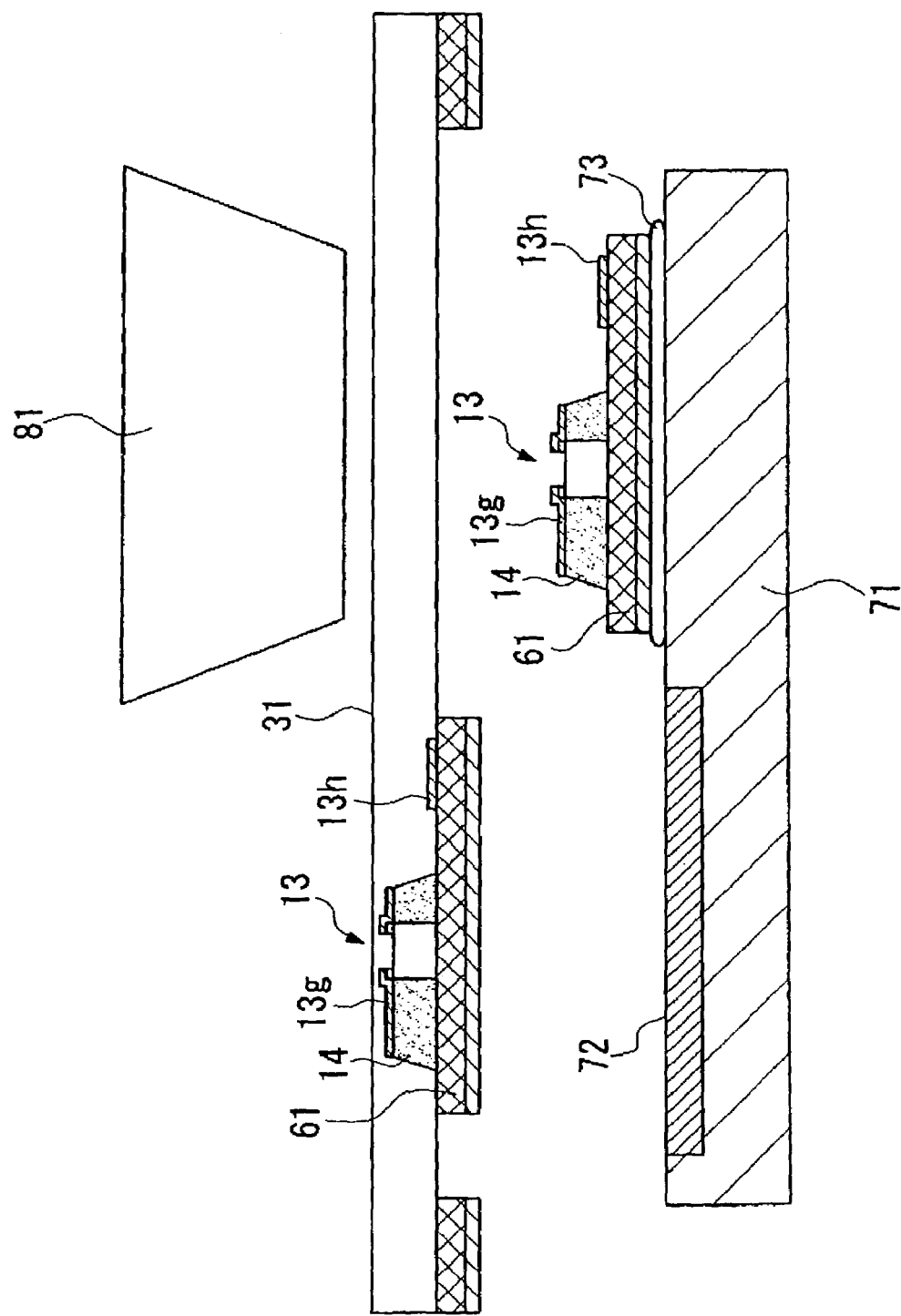
FIG. 15 is a schematic cross-sectional view showing Step 9 of the above-described fabrication method.

<Step 9>
FIG. 15 is a schematic cross-sectional view showing Step 9 of the method of making the semiconductor unit and the semiconductor apparatus according to this exemplary embodiment. In this step, the intermediate transfer film 31 is detached from the micro element tile 61.

After Step 6, the adhesive force of the entire surface of the intermediate transfer film 31 is preferably completely vanished by UV radiation or the like. Even after such treatment, the adhesive force slightly remains, and the micro element tile 61, which is light-weight and thin, can still be supported by the intermediate transfer film 31 after Step 6.

<Step 10>
This step is not shown. In this step, annealing is performed to permanently bond the micro element tile 61 to the final substrate 71.

Figure 16:
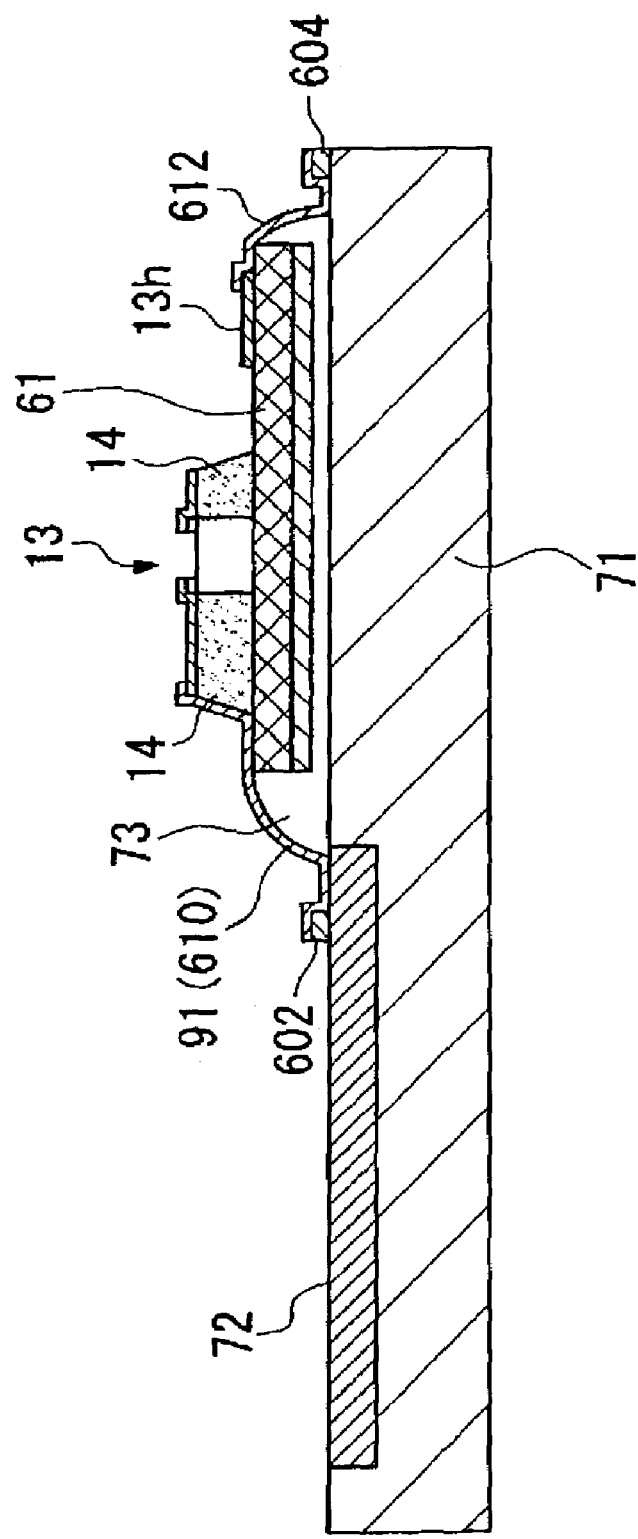
FIG. 16 is a schematic cross-sectional view showing Step 11 of the above-described fabrication method.

<Step 11>
FIG. 16 is a schematic cross-sectional view showing Step 11 of the method of making the semiconductor unit and the semiconductor apparatus according to this exemplary embodiment. In this step, the electrode of the micro element tile 61 is electrically connected to the circuit on the final substrate 71 via a lead 91 so as to complete production of one LSI chip.

The final substrate 71 may be a silicon semiconductor, a quartz substrate, or a plastic film. When the final substrate 71 is a silicon semiconductor, a charge-coupled device (CCD) may be provided to the substrate. The final substrate 71 made of glass, such as quartz, can be used to form a display, such as a liquid crystal display (LCD) or an organic electroluminescent display. When the final substrate 71 is a plastic film, the final substrate 71 may be used in a liquid crystal display, an organic electroluminescence panel, or an IC film package.

(Fifth Exemplary Embodiment)
In a fifth exemplary embodiment of the present invention, bonding of a silicon transistor (silicon semiconductor element) to a glass substrate for liquid crystal is explained. In this exemplary embodiment, Steps 1 to 11 correspond to Steps 1 to 11 described in the fourth exemplary embodiment. A significant difference between the fifth exemplary embodiment and the fourth exemplary embodiment lies in the method of selectively etching the sacrificial layer.

First, in Step 1, a silicon transistor is formed on a silicon-on-insulator (SOI) substrate by a common process.

An integrated circuit, i.e., a silicon device, a photodiode, a transistor, or a diode may be formed instead of the silicon transistor. The SOI substrate is provided with a silicon oxide film, which functions as the sacrificial layer.

In Step 2, dicing grooves are formed on the SOI substrate. The thickness of the dicing grooves is large enough to at least reach the silicon oxide film, which functions as the sacrificial layer on the SOI substrate. The dicing grooves are formed by etching, for example.

In Step 3, an intermediate transfer film is bonded on the surface of the SOI substrate (the surface at the silicon-transistor-side).

In Step 4, hydrofluoric acid is fed into the dicing grooves to selectively etch only the silicon oxide film, i.e., the sacrificial layer.

In Step 5, the sacrificial layer of silicon oxide is etched after the lapse of a predetermined time after Step 4. The silicon transistor (silicon semiconductor element) thereby becomes separated from the silicon substrate.

In Step 6, the intermediate transfer film is pulled away from the SOI substrate so as to separate the silicon transistor attached on the intermediate transfer film from the SOI substrate.

In Step 7, the intermediate transfer film moves to align the silicon transistor at a predetermined position of a final substrate. The final substrate here is a glass substrate for liquid crystal.

In Step 8, the silicon transistor aligned at the predetermined position of the final substrate is bonded on the final substrate by applying pressures through the intermediate transfer film using a collet. Since an adhesive is applied to the predetermined position, the silicon transistor can be bonded to the predetermined position of the final substrate.

In Step 9, the adhesive force of the intermediate transfer film is vanished so as to separate the intermediate transfer film from the silicon transistor. In Step 10, annealing is performed to permanently bond the silicon transistor to the final substrate.

In Step 11, the electrodes of the silicon transistor are connected to the circuit on the final substrate by leads so as to complete production of the glass substrate for liquid crystal, driving circuit therefor, and the like.

In this exemplary embodiment, Steps 5 to 11 described above in the fourth exemplary embodiment may be applied.

According to the methods of the fourth and fifth exemplary embodiments, the semiconductor element can be formed substantially monolithically on a semiconductor substrate which is difficult to use in a real monolithic process because of the mismatch.

Figure 24:
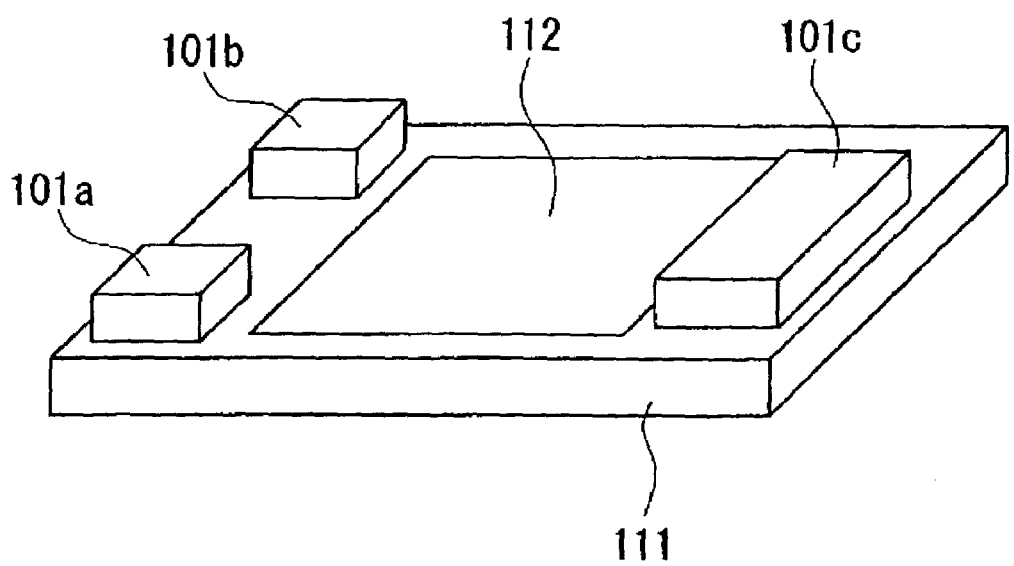
FIG. 24 is a schematic perspective view showing an example of a related art hybrid integrated circuit.

In the related art, a hybrid process has been employed to form a semiconductor element on a substrate composed of a different material. Examples thereof include forming surface emitting lasers, photodiodes, or high electron mobility transistors composed of gallium arsenide on silicon semiconductor substrates and bonding micro silicon transistors instead of thin film transistors (TFTs) for pixels of liquid crystal displays onto glass substrates. FIG. 24 is a schematic perspective view showing an example of related art integrated circuit. In FIG. 24, a silicon LSI chip 111 has an LSI region 112. A photodiode chip 101*a*, a surface emitting laser chip 101*b*, and a high electron mobility transistor chip 101*c* are bonded on the surface of the silicon LSI chip 111. The handling limit of the chip size according to the related art packaging technology has been (several ten micrometers in thickness×several hundred square micrometers). Accordingly, the volume of each of the photodiode chip 101*a*, the surface emitting laser chip 101*b*, and the high electron mobility transistor chip 101*c* is at least (several ten micrometers in thickness×several hundred square micrometers).

Figure 17:
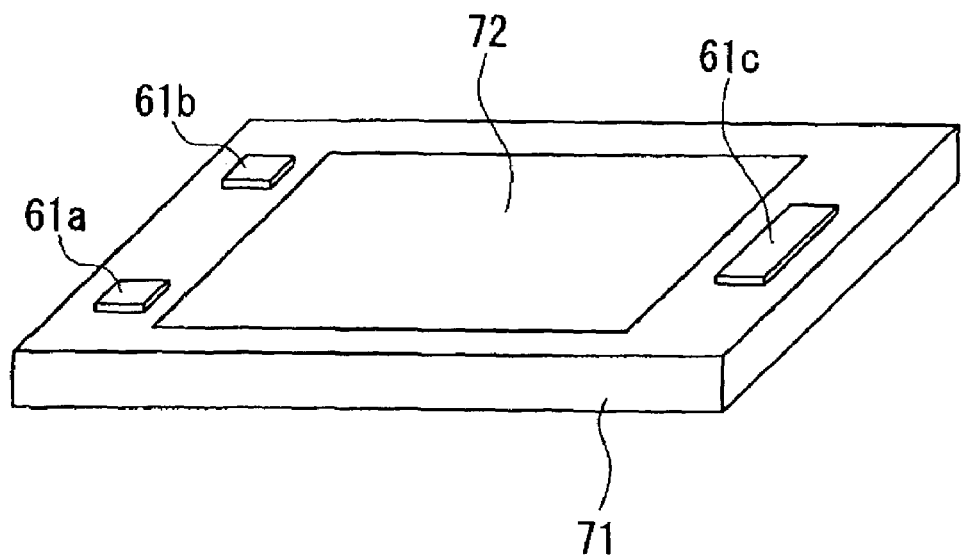
FIG. 17 is a schematic perspective view showing an exemplary integrated circuit made according to the method of the present invention.

FIG. 17 is a schematic perspective view of another example of a semiconductor apparatus (integrated circuit) made according to the method of this exemplary embodiment. The final substrate 71, i.e., the silicon LSI chip, has the LSI region 72. A photodiode tile 61*a*, a surface emitting laser tile 61*b*, and a high speed operating transistor (such as a MESFET, HBT, HEMT, or the like) 61*c* are bonded on the surface of the final substrate 71. HBT is a compound semiconductor heterojunction bipolar transistor. The photodiode tile 61*a*, the surface emitting laser tile 61*b*, and the high speed operating transistor 61*c* are fabricated as the micro element tiles 61 and bonded according to the method of the first exemplary embodiment. Accordingly, the size of the photodiode tile 61*a*, the surface emitting laser tile 61*b*, and the high speed operating transistor 61*c* can be reduced to (several micrometers in thickness×several ten square micrometers in area).

According to the method of this exemplary embodiment, a semiconductor element (micro element tile 61) having a size equal to an element formed by a monolithic process can be formed on any substrate, for example, a silicon, quarts, sapphire, metal, or ceramic substrate or a plastic film.

According to the methods of the fourth and fifth exemplary embodiments, preparation of semiconductor elements (semiconductor devices 13) is completed on a semiconductor substrate (substrate 10), and the semiconductor elements are then processed into micro element tiles 61. Thus, the semiconductor devices can be tested and screened in advance.

According to the methods of the fourth and fifth exemplary embodiments, as for the semiconductor substrate (substrate 10) from which the micro element tiles 61 are manufactured, the entire area of the semiconductor substrate, except for the regions where the dicing groove 21 are formed, can be used to make the semiconductor devices 13 (the micro element tiles 61). Thus, the areal efficiency of the semiconductor substrate (the substrate 10) can be increased, and the cost of manufacture can be decreased.

According to the methods of the fourth and fifth exemplary embodiments, the micro element tile 61 is mounted on the flexible intermediate transfer film 31. Thus, the micro element tile 61 can be selectively bonded to the final substrate 71.

According to the methods of the fourth and fifth exemplary embodiments, the preparation of the semiconductor elements, i.e., the micro element tiles 61, is completed prior to bonding to the final substrate 71. Thus, no complicated semiconductor process is necessary after bonding. Since the final substrate 71 with the micro element tile 61 bonded thereto need not to undergo an additional process, the efficiency of the manufacturing process can be enhanced.

Furthermore, since no complicated semiconductor process is necessary after the bonding of the micro element tile 61 to the final substrate 71, restriction as to the method for bonding the micro element tile 61 can be relaxed. For example, a bonding method with a low-heat-resistant material can be performed.

(Exemplary Applications)

Exemplary Applications of the semiconductor unit made according to the exemplary methods of the present invention are described below.

A first exemplary application is as follows. A surface emitting laser (vertical cavity surface emitting laser, VCSEL) and a photodiode (PD) are formed on a silicon LSI by the method of the fourth exemplary embodiment described above. In this manner, data can be exchanged using optical pulses between the silicon LSI and an external component. Thus, data can be exchanged between components not electrically connected to each other at a speed higher than when electric signals are used.

A second exemplary application is as follows. A high speed operating transistor (heterojunction bipolar transistor (HBT)) is formed on a silicon LSI by the method of the first exemplary embodiment described above. A high-speed analogue amplifier including the HBT is mounted inside the silicon IC to function as a component of a cellular phone of the like. In this manner, the wire length can be decreased, and the circuit can operate at a high rate. Moreover, as for the substrate 10 from which the micro element tiles 61 are formed, the entire area of the substrate 10 except for the regions where the dicing grooves 21 are formed can be used to form the semiconductor devices 13 (the micro element tiles 61). Thus, the areal efficiency of the expensive gallium arsenide substrate can be increased, and the cost of manufacture can be decreased.

A third exemplary application is as follows. Instead of thin film transistors (TFTs), micro silicon transistors are bonded using the method of the present invention so that they constitute pixels of a liquid crystal display, which is an electrooptical apparatus. To be more specific, silicon transistors are bonded to a glass substrate for liquid crystal by the method of the second exemplary embodiment described above. In this manner, switching function is enhanced compared to when TFTs are used. Since the percentage of the area of the liquid crystal display pixels occupied by the transistors is only several percent, portions other than the TFTs, which are significantly large, will be wasted if all pixels are formed by a TFT process. In contrast, according to the method of the second exemplary embodiment, micro silicon transistors can be highly densely formed on a silicon substrate, and then be separated from each other using the separating layer and the sacrificial layer so that only required parts are bonded on the substrate. Thus, the process can be streamlined, and the cost for manufacture can be dramatically decreased.

A fourth exemplary application is as follows. To each of pixels of an organic electroluminescent (EL) display apparatus, a micro silicon transistor is bonded instead of a thin film transistor (TFT) by the method of the present invention. The details of the making of the organic EL display apparatus, i.e., the electrooptic apparatus, are described below.

(Exemplary Electrooptic Apparatus)

Figure 18:
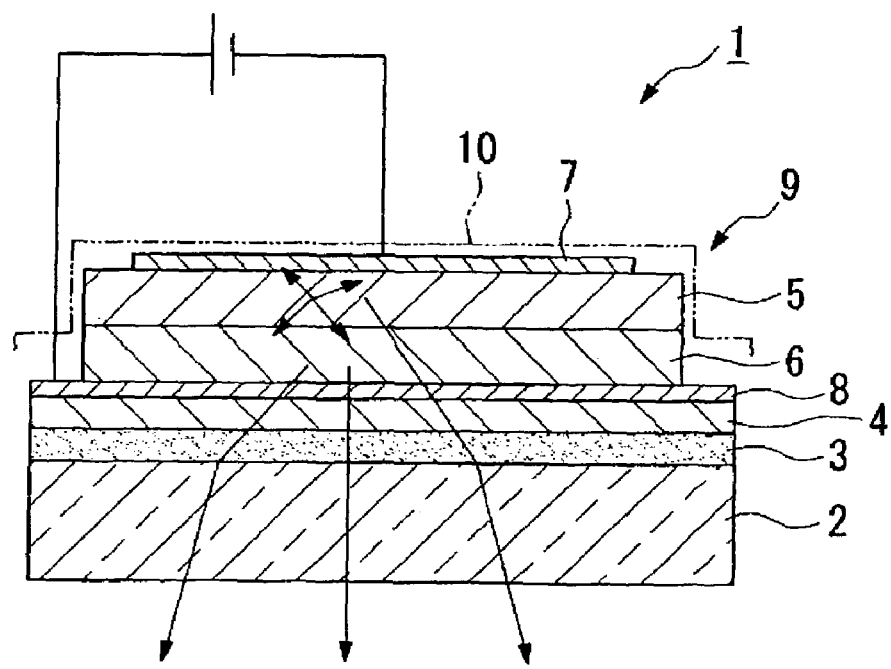
FIG. 18 is a schematic cross-sectional view of an electrooptic apparatus according to this exemplary embodiment.
Figure 19:
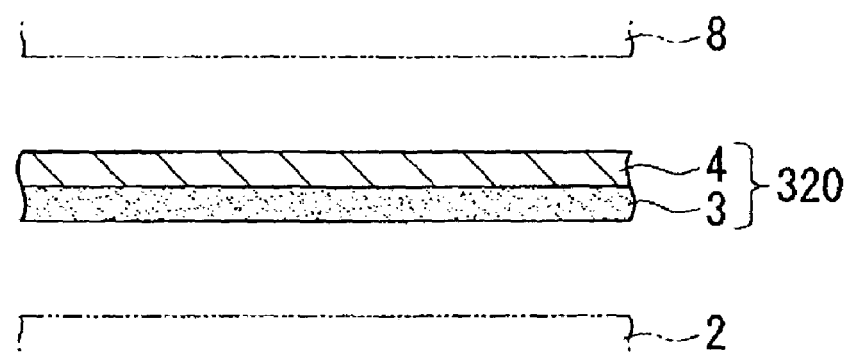
FIG. 19 is a cross-sectional view showing the layered component of the electrooptic apparatus.

An exemplary electrooptic apparatus, which is an application of this exemplary embodiment, will now be described with reference to FIGS. 18 and 19. FIG. 18 is a cross-sectional view showing an example of an organic EL apparatus, which is the electrooptic exemplary apparatus of this embodiment.

Referring to FIG. 18, an organic EL apparatus 1 includes a light transmission substrate (light transmission layer) 2; an organic EL element (light-emitting element) 9 including a cathode (electrode) 7 and an anode (electrode) 8 formed at one face of the substrate 2, a luminous layer 5 composed of an organic EL material placed between the electrodes, and a hole transport layer 6; and a low-refractive-index layer 3 and a sealing layer 4 optionally provided between the substrate 2 and the organic EL element 9. The low-refractive-index layer 3 is closer to the substrate 2 than is the sealing layer 4.

The surface of the organic EL apparatus 1 at a side opposite to the sealing layer 4 with the organic EL element 9 therebetween is covered by a sealing member 320 to prevent the organic EL element 9 with the electrodes 7 and 8 from being exposed to air or to reduce such exposure.

The anode 8 is formed on the sealing layer 4 by sputtering, ion plating, vacuum vapor deposition, or the like. The hole transport layer 6, the luminous layer 5, and the cathode 7 are sequentially deposited on the anode 8 to prepare the organic EL apparatus 1.

In the organic EL apparatus 1 shown in FIG. 18, light from the luminous layer 5 is emitted through the substrate 2 toward outside the apparatus. The substrate 2 is composed of a transparent or translucent material. Examples thereof include transparent glass, quartz, sapphire, and transparent synthetic resins, such as polyesters, acrylic resins, polycarbonates, and polyetherketones. In particular, inexpensive soda glass is suitable for the material of the substrate 2.

In contrast, when the light is emitted from the side opposite to the substrate, the substrate may be opaque. In such a case, ceramic, such as alumina, a metal sheet, such as a stainless steel sheet subjected to an insulating process such as surface oxidation, a thermosetting resin, a thermoplastic resin, or the like may be used to form the substrate.

The anode 8 is a transparent electrode composed of indium tin oxide (ITO) or the like and can transmit light. The hole transport layer 6 is composed of, for example, a triphenylamine derivative (TPD), a pyrazoline derivative, an arylamine derivative, a stilbene derivative, or a triphenyldiamine derivative. In particular, examples are found in Japanese Unexamined Patent Application Publication Nos. 63-70257, 63-175860, 2-135359, 2-135361, 2-209988, 3-37992, and 3-152184. A triphenyldiamine derivative is preferred. In particular, 4,4'-bis(N(3-methylphenyl)-N-phenylamino)biphenyl is preferred.

Instead of the hole transport layer, a hole injection layer may be formed. Alternatively, both the hole transport layer and the hole injection layer may be formed. In such cases, the hole injection layer is formed with, for example, copper phthalocyanine (CuPc), poly(phenylene vinylene) which is polytetrahydrothiophenylphenylene, 1,1-bis-(4-N,N-ditolylaminophenyl)cyclohexane, or tris(8-hydroxyquinolinol) aluminum. In particular, copper phthalocyanine (CuPc) is preferably used.

The luminous layer 5 may be formed with a low-molecular organic luminescent dye or a high-molecular luminescent material, i.e., a luminescent material such as a fluorescent material, a phosphorescence material, or an organic electroluminescent material such as, $Al_{q_3}$ (aluminum chelate complex). Among conjugated-system high-molecular luminescent materials, those containing polyfluorene structures or arylenevinylene are particularly preferred. Examples of the low-molecular luminescent materials include naphthalene derivatives, anthracene derivatives, perylene derivatives, polymethine-based dyes, xanthene-based dyes, coumarin-based dyes, cyanine-based dyes, 8-hydroquinoline and metal complexes of derivatives thereof, aromatic amines, tetraphenylcyclopentadiene derivatives, and known materials disclosed in Japanese Unexamined Patent Application Publication Nos. 57-51781 and 59-194393.

The cathode 7 is a metal electrode composed of aluminum (Al), magnesium (Mg), gold (Au), silver (Ag), or the like.

An electron transport layer or an electron injection layer maybe formed between the cathode 7 and the luminous layer 5. No limit is imposed as to the material to form the electron transport layer. Examples thereof include oxydiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and 8-hydroxyquinoline and metal complexes of derivatives thereof. In particular, as with the material to form the hole transport layer described above, examples include those described in Japanese Unexamined Patent Application Publication Nos. 63-70257, 63-175860, 2-135359, 2-135361, 2-209988, 3-37992, and 3-152184. In particular, 2-(4-biphenyl)-5-(4-t-butylphenyl)-1,3,4-oxadiazole, benzoquinone, anthraquinone, and tris(8-quinolinol)aluminum are preferred.

Although not shown in the drawing, the organic EL apparatus 1 of this exemplary embodiment is of an active matrix type, and a plurality of data lines and a plurality of scan lines are arranged into a grid on the substrate 2. Pixels are placed in regions partitioned by the data lines and the scan lines and are arranged in a matrix. In the related art, each pixel is connected to the above-described organic EL element 9 via a driving TFT, such as a switching transistor or a driving transistor. A driving signal is provided through the data line or the scan line to allow an electric current to flow between electrodes, and, as a result, the luminous layer 5 of the organic EL element 9 emits light toward outside the substrate 2, thereby lighting that pixel.

In this exemplary embodiment, a micro silicon transistor of the present invention is bonded to each pixel instead of the driving TFT, such as the switching transistor or the driving transistor, provided in the related art to each pixel. The bonding of the micro silicon transistor is conducted according to the method including Step 1 to Step 11 described above.

Compared to when TFTs are used, switching operation can be enhanced. Thus, an organic EL apparatus 1 that can rapidly change the display state can be manufactured.

Next, the specific structure of an electrooptic apparatus according to an exemplary application of this exemplary embodiment is described with reference to FIG. 20.

Figure 20:
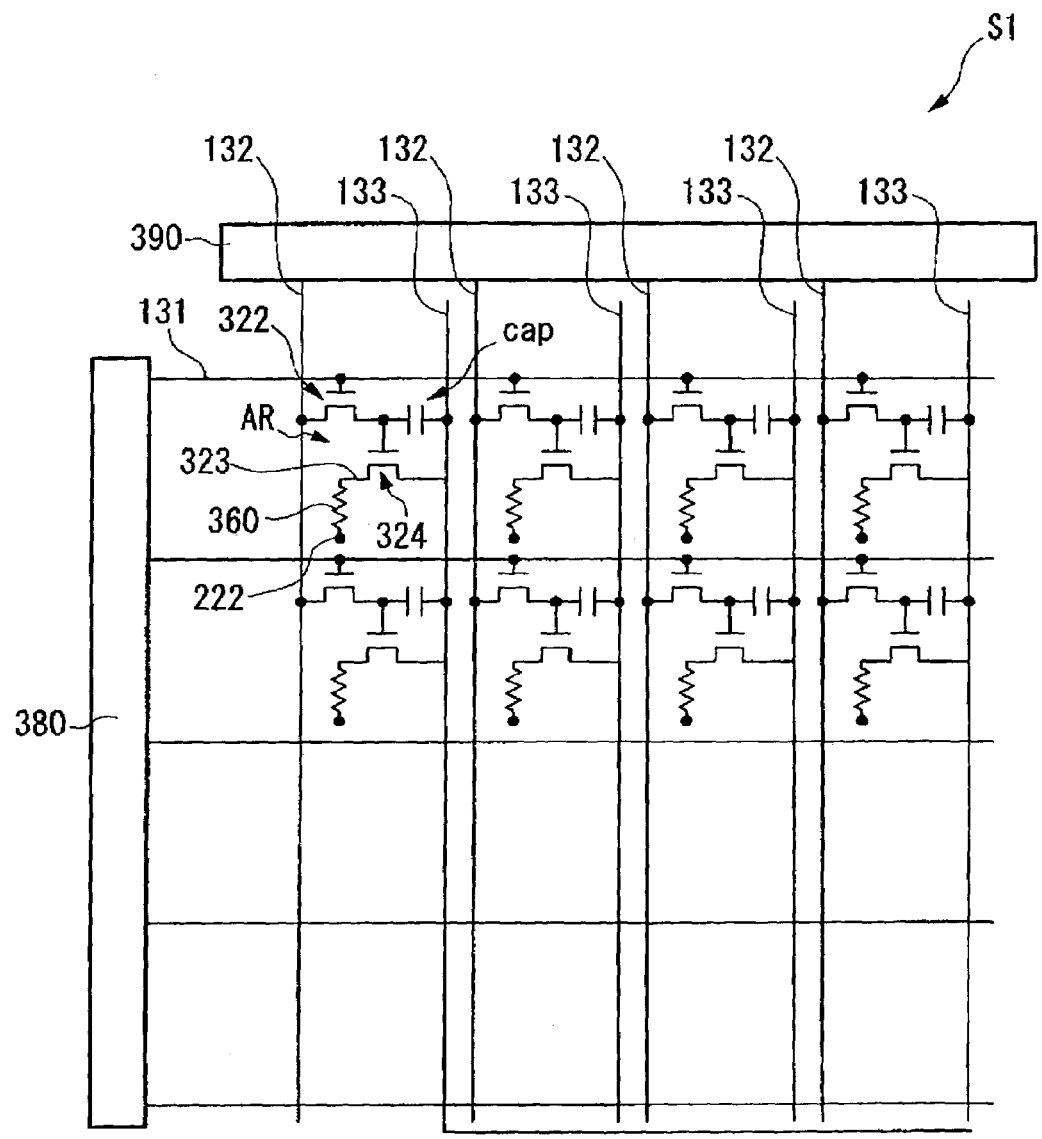
FIG. 20 is a schematic circuit diagram showing an active-matrix display.

FIG. 20 shows an exemplary application of the electrooptic apparatus of this exemplary embodiment into an active matrix display (electrooptic apparatus) using organic electroluminescent elements.

Referring to FIG. 20, an organic EL apparatus S1 includes a plurality of scan lines 131, a plurality of signal lines 132 extending orthogonal to the scan lines 131, and a plurality of common feed lines 133 juxtaposed with the plurality of signal lines 132, which are arranged on a substrate. A pixel (pixel region element) AR is provided at each intersection of a scan line 131 and a signal line 132.

A data-line-driving circuit 390 includes a shift register, a level shifter, a video line, and an analog switch and is connected to the signal lines 132.

A scan-line-driving circuit 380 includes a shift register and a level shifter and is connected to the scan lines 131. Each pixel region AR includes a first transistor 322 with a gate electrode to which a scan signal is supplied through the scan line 131; a hold capacitor cap for holding an image signal supplied from the signal line 132 via the first transistor 322; a second transistor 324 with a gate electrode to which the image signal held by the hold capacitor cap is supplied; a pixel electrode 323 into which a driving current flows via the common feed line 133 when the pixel electrode 323 electrically connects with the common feed line 133 via the second transistor 324; and a luminous region (luminous layer) 360 placed between the pixel electrode (anode) 323 and a counter electrode (cathode) 222.

The first transistor 322 and the second transistor 324 are micro silicon transistors bonded on the substrate of the organic EL display S1 according Step 1 to Step 11 of the method described above.

Under this structure, when the scan line 131 is driven to turn ON the first transistor 322, the potential of the signal line 132 at that time is held in the hold capacitor cap, and the state of conduction of the second transistor 324 is determined by the state of the hold capacitor cap. An electric current flows from the common feed line 133 to the pixel electrode 323 through the channel of the second transistor 324. Meanwhile, the electric current also flows into the counter electrode 222 through the luminous layer 360, and the luminous layer 360 emits light in an amount corresponding to the amount of current flowing therein.

(Exemplary Electronic Apparatus)

Examples of electronic apparatuses including the electrooptic apparatuses of this exemplary embodiment are described below.

Figure 21:
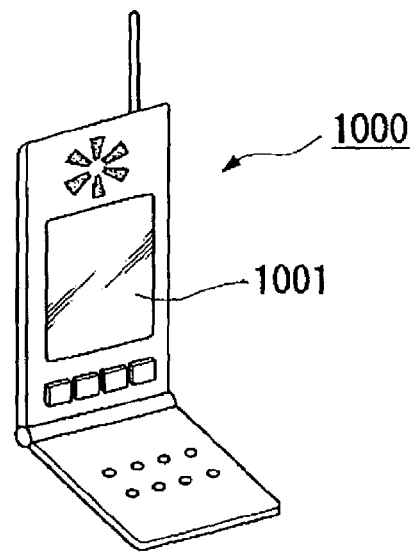
FIG. 21 is a schematic perspective view that shows an example of an electronic apparatus incorporating the electrooptic apparatus of this exemplary embodiment.

FIG. 21 is a perspective view of an exemplary cellular phone. Referring to FIG. 21, a cellular phone main body 1000 has a display 1001 including the electrooptic apparatus described above.

Figure 22:
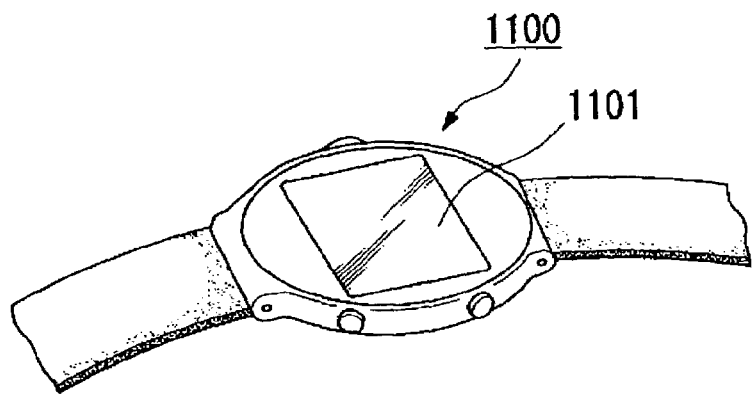
FIG. 22 is a schematic perspective view that shows another example of an electronic apparatus incorporating the electrooptic apparatus of this exemplary embodiment.

FIG. 22 is a perspective view of an exemplary wristwatch-type electronic apparatus. Referring to FIG. 22, a watch 1100 has a display section 1101 including the electrooptic apparatus described above.

Figure 23:
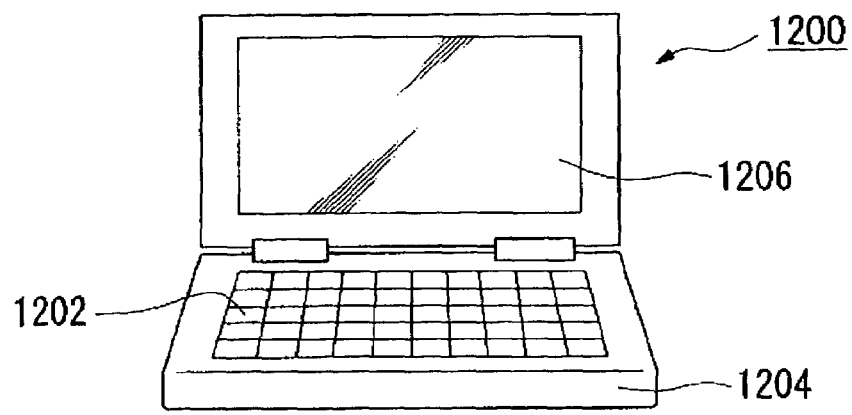
FIG. 23 is a schematic perspective view that shows yet another example of an electronic apparatus incorporating the electrooptic apparatus of this exemplary embodiment.

FIG. 23 is a perspective view of an exemplary portable information processing apparatus, such as a word processor or a personal computer. Referring to FIG. 23, an information processing apparatus 1200 includes an input section 1202 such as a keyboard, an information processing main unit 1204, and a display section 1206 including the electrooptic apparatus described above.

Since the exemplary electronic apparatuses shown in FIGS. 21 to 23 incorporate the electrooptic apparatuses described above, display quality is high, and the organic EL display is highly responsive and bright. Moreover the cost for manufacture is lower than conventional because the manufacturing method of the above-described exemplary embodiment is employed.

The technical scope of the present invention is not limited by the above-described exemplary embodiments. Various modifications are possible without departing from the spirit of the present invention. The specific materials and the layer structures described above are mere examples, and various modifications are possible.

[Advantages]

As is apparent from the above description, even when the resistance of the functional layer is high, the combined resistance of the highly conductive layer and the functional layer can be reduced because the resistance of the highly conductive layer is low. Thus, the electric resistance of the semiconductor unit as a whole can be decreased. The present invention is particularly effective when the thickness of the functional layer is small and the resistance thereof is high.

Moreover, according to the manufacturing method of the present invention, semiconductor elements formed on a semiconductor substrate are separated from the semiconductor substrate and are made into micro tiles. Thus, the micro tiles of the semiconductor elements can be bonded to any workpiece to form an integrated circuit.

What is claimed is:

1. A semiconductor unit, comprising:
a functional layer including a semiconductor layer and a mirror
a highly conductive layer disposed between the functional layer and an external substrate, the highly conductive layer contacting the mirror; and
an insulating layer disposed on a face of the highly conductive layer and between the highly conductive layer and the external substrate.

2. A semiconductor apparatus, comprising:
a semiconductor substrate;
a functional layer including a semiconductor layer, a first mirror and a second mirror;
a highly conductive layer disposed between the functional layer and the semiconductor substrate; and
an insulating layer disposed on a face of the semiconductor substrate, the insulating layer being disposed between the highly conductive layer and the semiconductor substrate,
the first mirror sharing a common boundary with the highly conductive layer.

3. The semiconductor apparatus of claim 2, the highly conductive layer being a high carrier density layer.

4. A semiconductor apparatus comprising: a substrate; and a semiconductor unit including a first mirror, a second mirror and a semiconductor layer disposed between the first mirror and the second mirror,
the first mirror disposed between the semiconductor layer and the substrate,
the first mirror including a highly conductive layer,
the highly conductive layer including an active sublayer, a first electron supply sublayer and a second electron sublayer, and
the active sublayer being disposed between the first electron supply sublayer and the second electron supply sublayer.

5. The semiconductor apparatus of claim 4, the second electron supply sublayer being capable of generating an electron gas and formed to allow travel of the gas from the electron supply sublayer to the active sublayer.

6. The semiconductor apparatus of claim 4, the semiconductor layer including a current aperture having a ring shape.

7. The semiconductor apparatus of claim 4, the semiconductor layer including a current aperture that has a first portion made of a semiconductor material, the first portion being surrounded by a second portion made of an oxide material.

8. The semiconductor apparatus of claim 4, the highly conductive layer being a high carrier mobility layer.

9. The semiconductor apparatus of claim 4, the semiconductor unit being a surface emitting laser.

10. The semiconductor apparatus of claim 9, the surface emitting laser including a current aperture that is formed by an insulating material.

11. The semiconductor apparatus of claim 10, the insulating material being an oxide layer.

12. The semiconductor apparatus of claim 4, the semiconductor layer including an active layer and a cladding layer.

13. The semiconductor apparatus of claim 4, the semiconductor unit further including a first electrode and a second electrode to drive the semiconductor unit, the first electrode being formed on the first mirror and the second electrode being formed on the second mirror through a contact layer.

* * * * *